US012474636B2

(12) United States Patent
Takahashi

(10) Patent No.: US 12,474,636 B2
(45) Date of Patent: Nov. 18, 2025

(54) PRE-WET LIQUID, RESIST FILM FORMING METHOD, PATTERN FORMING METHOD, AND KIT

(71) Applicant: FUJIFILM Corporation, Tokyo (JP)

(72) Inventor: Satomi Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 760 days.

(21) Appl. No.: 17/693,405

(22) Filed: Mar. 13, 2022

(65) Prior Publication Data

US 2022/0197137 A1 Jun. 23, 2022

Related U.S. Application Data

(63) Continuation of application No. PCT/JP2020/032580, filed on Aug. 28, 2020.

(30) Foreign Application Priority Data

Sep. 27, 2019 (JP) ................................ 2019-177986

(51) Int. Cl.

| | |
|---|---|
| ***G03F 7/00*** | (2006.01) |
| ***G03F 7/20*** | (2006.01) |
| ***G03F 7/32*** | (2006.01) |
| ***G03F 7/40*** | (2006.01) |

(52) U.S. Cl.

CPC .......... *G03F 7/0035* (2013.01); *G03F 7/2006* (2013.01); *G03F 7/32* (2013.01); *G03F 7/40* (2013.01)

(58) Field of Classification Search

CPC ........ G03F 7/0035; G03F 7/2006; G03F 7/32; G03F 7/16; B05D 3/10; B05D 7/24

See application file for complete search history.

(56) References Cited

U.S. PATENT DOCUMENTS

2002/0168874 A1* 11/2002 Davlin .................. H01L 21/312 438/758
2004/0191680 A1* 9/2004 Araki .................... C07F 9/5456 526/280
2007/0254235 A1* 11/2007 Allen .................... G03F 7/0757 430/270.1
2011/0312190 A1 12/2011 Ichino et al.
2018/0004088 A1* 1/2018 Maruyama ................. C08J 5/18
2018/0087010 A1* 3/2018 Takahashi ............... G03F 7/322
2019/0171102 A1 6/2019 Kamimura et al.
2019/0258165 A1 8/2019 Nakamura et al.
2020/0023288 A1 1/2020 Kamimura
2020/0131118 A1 4/2020 Kamimura

FOREIGN PATENT DOCUMENTS

JP 2004039828 2/2004
JP 2012000589 1/2012
WO 2016181753 11/2016
WO WO-2018025790 A1 * 2/2018 ............. B01D 19/00
WO 2018043690 3/2018
WO 2018092760 5/2018
WO WO-2018092760 A1 * 5/2018 ........... G03F 7/0045
WO 2018180735 10/2018
WO 2019009363 1/2019

OTHER PUBLICATIONS

"International Search Report (Form PCT/ISA/210) of PCT/JP2020/032580," mailed on Oct. 27, 2020, with English translation thereof, pp. 1-6.
"Written Opinion of the International Searching Authority (Form PCT/ISA/237)" of PCT/JP2020/032580, mailed on Oct. 27, 2020, with English translation thereof, pp. 1-6.

* cited by examiner

*Primary Examiner* — Jonathan Johnson
*Assistant Examiner* — Alexander N. Lee
(74) *Attorney, Agent, or Firm* — JCIPRNET

(57) ABSTRACT

The pre-wet liquid is provided. The pre-wet liquid has a surface tension of 29.0 mN/m or more, a viscosity of 1.8 cP or less, and a vapor pressure of 2.5 to 5.0 mmHg, in a case of consisting of a single solvent, the pre-wet liquid has an SP value of 25.0 $MPa^{1/2}$ or less and does not have a benzene ring group, and in a case of consisting of a mixed solvent, the pre-wet liquid satisfies the requirement 1 in which is a mixed solvent consisting of only two or more kinds of organic solvents A having specific SP value and specific surface tension and having no benzene ring group or the requirement 2 in which is a mixed solvent of an organic solvent A and an organic solvent B having specific SP value and specific surface tension.

8 Claims, No Drawings

PRE-WET LIQUID, RESIST FILM FORMING METHOD, PATTERN FORMING METHOD, AND KIT

CROSS-REFERENCE TO RELATED APPLICATIONS

This application is a Continuation of PCT International Application No. PCT/JP2020/032580 filed on Aug. 28, 2020, which claims priority under 35 U.S.C. § 119(a) to Japanese Patent Application No. 2019-177986 filed on Sep. 27, 2019. The above application is hereby expressly incorporated by reference, in its entirety, into the present application.

BACKGROUND OF THE INVENTION

1. Field of the Invention

The present invention relates to a pre-wet liquid, a resist film forming method, a pattern forming method, and a kit.

2. Description of the Related Art

In the photolithography process in the manufacturing process of a semiconductor device, an actinic ray-sensitive or radiation-sensitive resin composition (hereinafter, also referred to as a "resist composition") is applied onto a substrate such as a semiconductor wafer (hereinafter, also referred to as a "wafer") to form an actinic ray-sensitive or radiation-sensitive film (hereinafter, also referred to as a "resist film"). Steps such as a step of exposing the formed resist film, a step of developing the exposed resist film, and a step of forming a predetermined pattern are further carried out sequentially to form a resist pattern on the wafer.

In recent years, with the further miniaturization of semiconductor devices, there is a demand for thinner resist films. In addition, there is also a demand for a technique for forming a uniform resist film by using a small amount of resist composition. As such a technique, there is known a method of applying a chemical liquid called a pre-wet liquid or the like onto a substrate before applying the resist composition onto the substrate. JP2012-000589A discloses "the pre-wet liquid that is a mixed liquid having a higher surface tension than a coating liquid obtained by mixing a solvent capable of dissolving a coating film component and a high surface tension liquid having a higher surface tension than the solvent (claim 1).

SUMMARY OF THE INVENTION

By the way, in recent years, it has been required to be able to form a good resist film in which no coating defects are observed even in a case where a small amount of resist composition is used mainly from the viewpoint of economic efficiency.

Accordingly, an object of the present invention is to provide a pre-wet liquid with which the required amount of a resist composition required for forming a good resist film (hereinafter, these characteristics are also referred to as "having excellent resist-saving properties") can be reduced. In addition, another object of the present invention is to provide a resist film forming method, a pattern forming method, and a kit, which are related to the pre-wet liquid.

The inventors of the present invention have conducted intensive studies to achieve the objects, and as a result, they have found that the objects can be achieved by the following configurations.

[1] A pre-wet liquid having a surface tension of 29.0 mN/m or more, a viscosity of 1.8 cP or less, and a vapor pressure of 2.5 to 5.0 mmHg, wherein the pre-wet liquid consists of a single solvent which is one kind of organic solvent or a mixed solvent of two or more kinds of organic solvents, in a case where the pre-wet liquid consists of the single solvent, the organic solvent has an SP value of 25.0 $MPa^{1/2}$ or less and does not have a benzene ring group, and in a case where the pre-wet liquid consists of the mixed solvent, the mixed solvent satisfies the following requirement 1 or requirement 2, requirement 1: the mixed solvent is a mixed solvent consisting of only two or more kinds of organic solvents A, and the organic solvent A is an organic solvent which has an SP value of 25.0 $MPa^{1/2}$ or less and a surface tension of 29.0 mN/m or more and does not have a benzene ring group, requirement 2: the mixed solvent is a mixed solvent of the organic solvent A and an organic solvent B, and the organic solvent B is an organic solvent which has an SP value of 25.0 $MPa^{1/2}$ or less and a surface tension of less than 29.0 mN/m.

[2] The pre-wet liquid according to [1], in which the organic solvent A is an organic solvent selected from the group consisting of ethyl pyruvate, methyl pyruvate, methyl acetoacetate, methyl methoxyacetate, acetyl acetone, dimethyl malonate, methyl 3-methoxypropionate, diethyl oxalate, ethyl 2-methylacetoacetate, acetonyl acetone, and 1,2-diacetoxypropane.

[3] The pre-wet liquid according to [1] or [2], in which the organic solvent B is an organic solvent selected from the group consisting of propylene glycol monomethyl ether acetate, propylene glycol monomethyl ether, butyl acetate, isoamyl acetate, amyl acetate, butyl propionate, isobutyl propionate, and pentyl acetate.

[4] A pre-wet liquid consisting of ethyl pyruvate.

[5] The pre-wet liquid according to any one of [1] to [4], in which the pre-wet liquid has a vapor pressure of 2.8 to 4.7 mmHg.

[6] The pre-wet liquid according to any one of [1] to [5], in which the pre-wet liquid has a vapor pressure of 3.2 to 4.2 mmHg.

[7] The pre-wet liquid according to any one of [1] to [6], in which the pre-wet liquid has a viscosity of 1.4 cP or less.

[8] The pre-wet liquid according to any one of [1] to [4], in which the pre-wet liquid has a viscosity of 1.4 cP or less and a vapor pressure of 2.8 to 4.7 mmHg.

[9] The pre-wet liquid according to any one of [1] to [4], in which the pre-wet liquid has a viscosity of 1.4 cP or less and a vapor pressure of 3.2 to 4.2 mmHg.

[10] The pre-wet liquid according to any one of [1] to [9], in which the pre-wet liquid is used by being applied onto a substrate onto which a resist composition for ArF exposure, a resist composition for EUV exposure, or a resist composition for KrF exposure is applied.

[11] A resist film forming method comprising:

a pre-wetting step of applying the pre-wet liquid according to any one of [1] to [10] onto a substrate;

a resist film forming step of applying a resist composition onto the substrate after the pre-wetting step.

[12] A resist film forming method comprising:

a pre-wetting step of applying the pre-wet liquid according to any one of [1] to [10] onto a substrate;

a resist film forming step of forming a resist film onto the substrate after the pre-wetting step, by using a resist composition;

an exposure step of exposing the resist film; and a development step of developing the exposed resist film by using a developing liquid, in which the resist composition contains a resin consisting of at least one repeating unit selected from the group consisting of a repeating unit represented by Formula (a), a repeating unit represented by Formula (b), a repeating unit represented by Formula (c), and a repeating unit represented by Formula (d), and a repeating unit represented by Formula (e), (a)

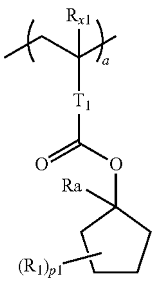

(b)

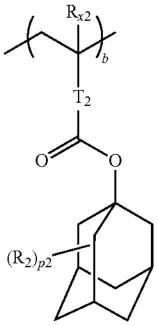

(c)

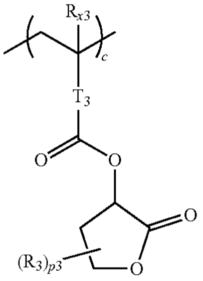

(d)

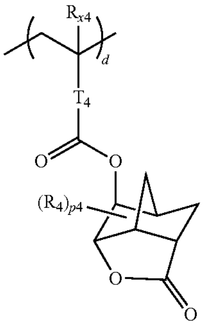

-continued (e)

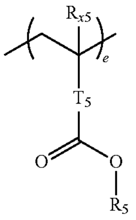

$R_{x1}$ to $R_{x5}$ each independently represent a hydrogen atom or an alkyl group which may have a substituent, $R_1$ to $R_4$ each independently represent a monovalent substituent, $p_1$ to $p_4$ each independently represent 0 or a positive integer, $R_a$ represents a linear or branched alkyl group, $T_1$ to $T_5$ each independently represent a single bond or a divalent linking group, $R_5$ represents a monovalent organic group, and a to e are represented in terms of % by mole and each independently represent numbers in ranges of $0 \le a \le 100$, $0 \le b \le 100$, $0 \le c < 100$, $0 \le d < 100$, and $0 \le e < 100$, respectively, provided that $a+b+c+d+e=100$ is satisfied, and $a+b \ne 0$ is satisfied, and provided that the repeating unit represented by Formula (e) is different from any one of the repeating units represented by Formulae (a) to (d).

[13] A kit comprising:

the pre-wet liquid according to any one of [1] to [10]; and a resist composition, in which the resist composition contains a resin consisting of at least one repeating unit selected from the group consisting of a repeating unit represented by Formula (a), a repeating unit represented by Formula (b), a repeating unit represented by Formula (c), and a repeating unit represented by Formula (d), and a repeating unit represented by Formula (e), (a)

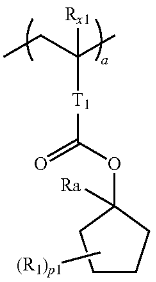

(b)

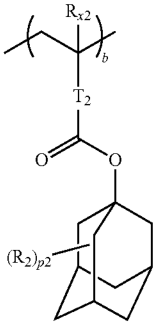

-continued (c)

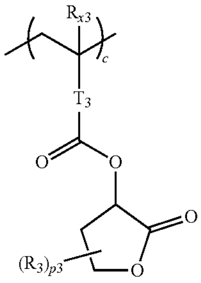

(d)

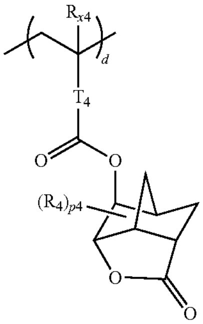

(e)

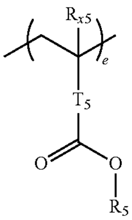

$R_{x1}$ to $R_{x5}$ each independently represent a hydrogen atom or an alkyl group which may have a substituent, $R_1$ to $R_4$ each independently represent a monovalent substituent, $p_1$ to $p_4$ each independently represent 0 or a positive integer, $R_a$ represents a linear or branched alkyl group, $T_1$ to $T_5$ each independently represent a single bond or a divalent linking group, $R_5$ represents a monovalent organic group, and a to e are represented in terms of % by mole and each independently represent numbers in ranges of $0 \leq a \leq 100$, $0 \leq b \leq 100$, $0 \leq c < 100$, $0 \leq d < 100$, and $0 \leq e < 100$, respectively, provided that $a+b+c+d+e=100$ is satisfied, and $a+b \neq 0$ is satisfied, and provided that the repeating unit represented by Formula (e) is different from any one of the repeating units represented by Formulae (a) to (d).

[14] A kit comprising:

the pre-wet liquid according to any one of [1] to [10]; and a resist composition, in which the resist composition contains a resin having a repeating unit which has a phenolic hydroxyl group and having a group which is decomposed under an action of an acid to generate a polar group.

[15] A kit comprising:

the pre-wet liquid according to any one of [1] to [10]; and a resist composition, in which the resist composition contains a hydrophobic resin and a resin having a group which is decomposed under an action of an acid to generate a polar group.

According to the present invention, it is possible to provide a pre-wet liquid having excellent resist-saving properties. In addition, it is also possible to provide a resist film forming method, a pattern forming method, and a kit, which are related to the pre-wet liquid.

DESCRIPTION OF THE PREFERRED EMBODIMENTS

In the following description, the present invention will be described in more detail.

The description of configuration requirements described below can be made based on representative embodiments of the present invention; however, the present invention is not limited to such embodiments.

In the present specification, the numerical value range indicated by using "to" means a range including the numerical values before and after "to" as the lower limit value and the upper limit value, respectively.

In addition, in the present specification, "preparation" has the meaning, in addition to preparing a specific material by synthesizing or blending, including procurement of a predetermined product through purchase or the like.

In addition, in the present specification, "ppm" means "parts-per-million ($10^{-6}$)," "ppb" means "parts-per-billion ($10^{-9}$)," "ppt" means "parts-per-trillion ($10^{-12}$)," and "ppq" means "parts-per-quadrillion ($10^{-15}$)."

In addition, in the present specification, 1 Å (angstrom) corresponds to 0.1 nm.

In addition, the present specification, in a case where there is no description regarding whether a group (atomic group) is substituted or unsubstituted, as long as the effects of the present specification are not reduced, the group includes both the group having no substituent and the group having a substituent. For example, the "alkyl group" includes not only an alkyl group having no substituent (an unsubstituted alkyl group) but also an alkyl group having a substituent (a substituted alkyl group). This also applies to each compound.

In addition, in the present specification, "radiation" means, for example, far ultraviolet rays, extreme ultraviolet (EUV) rays, X-rays, electron beams. In addition, in the present specification, light means actinic rays or radiation.

Unless otherwise specified, "exposure" in the present specification includes not only exposure with a bright line spectrum of a mercury lamp, far ultraviolet rays typified by an excimer laser (an ArF excimer laser, a KrF excimer laser, and the like), extreme ultraviolet rays, X-rays, EUV light, or the like, but also drawing with particle beams such as electron beams and ion beams.

In addition, in the present specification, in a case where a value of a parameter which is capable of being changed depending on the temperature is described, it is a value at 25° C. (room temperature) unless otherwise specified. For example, in the present specification, the "viscosity" means a viscosity at 25° C., unless otherwise specified.

In the present specification, the "viscosity" is a value measured at a rotation speed of 100 rpm by using a digital viscometer (model number: RVDV-I) manufactured by Brookfield Engineering Laboratories, Inc.

In the present specification, the "surface tension" is a value measured by the pulling up method (the Wilhelmy plate method) using DY-300 manufactured by Kyowa Interface Science Co., Ltd.

In the present specification, the "vapor pressure" in the pre-wet liquid is determined according to the following expression from the vapor pressure of each organic solvent contained in the pre-wet liquid at 25° C. and the mass fraction of each organic solvent in the pre-wet liquid. In the present specification, the symbol "Σ" is intended to indicate a sum.

$$\text{Expression: (vapor pressure of pre-wet liquid)} = \sum((\text{vapor pressure of each organic solvent at } 25°\,C.) \times (\text{mass fraction of each organic solvent}))$$

As the vapor pressure of each organic solvent, a value in the literature may be used.

In the present specification, the "SP value" means the Hansen solubility parameter, which is a value (unit: $MPa^{1/2}$) represented by δ according to the following calculation expression.

$$\delta = (\delta_d^2 + \delta_p^2 + \delta_h^2)^{1/2}$$

$\delta_d$ represents the dispersion element, $\delta_p$ represents the polarity element, and $\delta_h$ represents the hydrogen bond element (all units thereof are $MPa^{1/2}$).

In the present specification, δ, $\delta_d$, $\delta_p$, and $\delta_h$ of each organic solvent are calculated using Hansen Solubility Parameter in Practice (HSPiP).

In the present specification, the boiling point is intended to indicate a boiling point at 1 atm.

In the present specification, the organic solvent that constitutes the pre-wet liquid is intended to indicate an organic compound contained in an amount of more than 10,000 mass ppm in the total mass of the chemical liquid, where the organic compound is liquid in an environment of 25° C. and 1 atm in a case where it is present as a pure substance.

[Pre-Wet Liquid]

The pre-wet liquid according to the embodiment of the present invention is a pre-wet liquid having a surface tension of 29.0 mN/m or more, a viscosity of 1.8 cP or less, and a vapor pressure of 2.5 to 5.0 mmHg, in which the pre-wet liquid consists of a single solvent which is one kind of organic solvent or a mixed solvent of two or more kinds of organic solvents, in a case where the pre-wet liquid consists of the single solvent, the organic solvent has an SP value of 25.0 $MPa^{1/2}$ or less and does not have a benzene ring group, and in a case where the pre-wet liquid consists of the mixed solvent, the mixed solvent satisfies the following requirement 1 or requirement 2, requirement 1: the mixed solvent is a mixed solvent consisting of only two or more kinds of organic solvents A, and the organic solvent A is an organic solvent which has an SP value of 25.0 $MPa^{1/2}$ or less and a surface tension of 29.0 mN/m or more and does not have a benzene ring group, requirement 2: the mixed solvent is a mixed solvent of the organic solvent A and an organic solvent B, and the organic solvent B is an organic solvent which has an SP value of 25.0 $MPa^{1/2}$ or less and a surface tension of less than 29.0 mN/m.

The mechanism by which the objects of the present invention are achieved by the pre-wet liquid having such configurations is not clear; however, the inventors of the present invention presume as follows.

First, since the pre-wet liquid according to the embodiment of the present invention has a viscosity of a predetermined level or less, a resist composition supplied on the pre-wet liquid easily spreads wettably. Further, since the vapor pressure of the pre-wet liquid is not too high, the evaporation of the pre-wet liquid does not become excessive, which prevents the inhibition of the uniformly wettable spreading (particularly, at the end part of the substrate) in a case where the substrate is cooled by the heat of vaporization in association with the evaporation of the pre-wet liquid and thus the resist composition becomes highly viscous on the substrate. On the other hand, since the vapor pressure of the pre-wet liquid is not too low, the pre-wet liquid remains in the resist film, which suppresses the generation of coating defects. Further, it is presumed that since an organic solvent having a surface tension of a predetermined level or more and an SP value of a predetermined level or less is used in the pre-wet liquid according to the embodiment of the present invention, the difference (the hysteresis) of contact angles of the pre-wet liquid with respect to the substrate between in the traveling direction and in the receding direction is small, whereby the resist composition can be uniformly spread wettably on the pre-wet liquid.

For the above reasons, it is presumed that in a case where the pre-wet liquid according to the embodiment of the present invention is used, even a small amount of resist composition can be uniformly spread wettably on the substrate, and thus good resist-saving properties are realized.

Hereinafter, that the resist-saving properties of the pre-wet liquid are excellent is also referred to as that the effects of the present invention are excellent.

[Physical Properties of Pre-Wet Liquid]

The pre-wet liquid according to the embodiment of the present invention has a surface tension of 29.0 mN/m or more, preferably 29.0 to 50.0 mN/m, and more preferably 29.5 to 40.0 mN/m.

The pre-wet liquid according to the embodiment of the present invention has a viscosity of 1.8 cP or less, preferably 1.6 cP or less, and more preferably 1.4 cP or less. The lower limit thereof is not particularly limited, and it is, for example, 0.1 cP or more.

Above all, it is preferable that the viscosity of the pre-wet liquid is within the above range and the vapor pressure is within the following suitable range.

The pre-wet liquid according to the embodiment of the present invention has a vapor pressure of 2.5 to 5.0 mmHg, preferably 2.8 to 4.7 mmHg, and more preferably 3.2 to 4.2 mmHg.

Among the organic solvents contained in the pre-wet liquid according to the embodiment of the present invention, the SP value of the organic solvent (a single solvent in a case of the pre-wet liquid consisting of the single solvent) that exhibits the highest SP value is preferably 10.0 to 24.5 $MPa^{1/2}$, and more preferably 18.0 to 23.0 $MPa^{1/2}$.

[Pre-Wet Liquid Consisting of Single Solvent]

The pre-wet liquid according to the embodiment of the present invention may be a pre-wet liquid consisting of a single solvent which is one kind of organic solvent.

Here, that the pre-wet liquid consists of a single solvent means that the pre-wet liquid substantially consists of only one kind of organic solvent (a single solvent).

Specifically, it means that the content of the above-described one kind of organic solvent (the single solvent) is more than 98% by mass and 100% by mass or less (preferably 99% to 100% by mass and more preferably 99.9% to 100% by mass) with respect to the total mass of the pre-wet liquid.

The above-described one kind of organic solvent (the single solvent) is an organic solvent that singly satisfies each of the above-described conditions regarding the physical properties (surface tension, viscosity, vapor pressure, and the like) of the pre-wet liquid, and the same applies to the preferred conditions thereof.

In addition, the SP value of the above-described one kind of organic solvent (the single solvent) is 25.0 $MPa^{1/2}$ or less, and it is preferably 10.0 to 24.5 $MPa^{1/2}$, and more preferably 18.0 to 23.0 $MPa^{1/2}$.

The boiling point of the above-described one kind of organic solvent (the single solvent) is preferably 100° C. to 250° C. and more preferably 120° C. to 200° C.

The molecular weight of the above-described one kind of organic solvent (the single solvent) is preferably 60 to 500 and more preferably 80 to 250.

The above-described one kind of organic solvent (the single solvent) does not have a benzene ring group. In a case where the above-described one kind of organic solvent has benzene ring groups, the surface tension of the pre-wet liquid tends to increase since the benzene ring groups interact more strongly due to the π-π electron interaction; however, on the other hand, the benzene ring groups easily interact with the solid content (the photoacid generator and the like) in the resist composition to cause coating unevenness, and thus the desired effect cannot be obtained.

The benzene ring group which is not contained in the above-described one kind of organic solvent is intended to include not only a benzene ring group that is present in a monocyclic state but also, for example, a benzene ring group in a polycycle in which the benzene ring group is present as a partial structure in a naphthalene ring group.

It is also preferable that the above-described one kind of organic solvent (the single solvent) has an ester group (—CO—O—, both ends of which are bonded to carbon atoms).

In addition, it is also preferable that the above-described one kind of organic solvent (the single solvent) has one or more (preferably 2 or more and more preferably 2 to 5) carbonyl groups. The carbonyl group may be a carbonyl group of a form that is contained in the ester group.

The above-described one kind of organic solvent (the single solvent) may be the organic solvent A described later as long as predetermined conditions are satisfied.

The above-described one kind of organic solvent (the single solvent) is preferably ethyl pyruvate.

That is, the pre-wet liquid according to the embodiment of the present invention may be a pre-wet liquid consisting of ethyl pyruvate.

That the pre-wet liquid according to the embodiment of the present invention consists of ethyl pyruvate means that the pre-wet liquid substantially consists of only ethyl pyruvate.

Specifically, it means that the content of ethyl pyruvate is more than 98% by mass and 100% by mass or less (preferably 99% to 100% by mass and more preferably 99.9% to 100% by mass) with respect to the total mass of the pre-wet liquid.

[Pre-Wet Liquid Consisting of Mixed Solvent]

The pre-wet liquid according to the embodiment of the present invention may be a pre-wet liquid consisting of a mixed solvent of two or more kinds of organic solvent.

Here, that the pre-wet liquid consists of a mixed solvent means that the pre-wet liquid substantially consists of only the mixed solvent.

Specifically, it means that the content of the mixed solvent (the total content of the two or more kinds of organic solvent) is more than 98% by mass and 100% by mass or less (preferably 99% to 100% by mass and more preferably 99.9% to 100% by mass) with respect to the total mass of the pre-wet liquid.

The above-described mixed solvent satisfies as the whole mixed solvent the physical properties (surface tension, viscosity, vapor pressure, and the like) of the pre-wet liquid above-described, and the same applies to the preferred conditions thereof.

The mixed solvent satisfies the requirement 1 or the requirement 2 described below.

<Mixed Solvent that Satisfies Requirement 1>

The requirement 1 is shown below.

requirement 1: the mixed solvent is a mixed solvent consisting of only two or more kinds of organic solvents A, and the organic solvent A is an organic solvent which has an SP value of 25.0 $MPa^{1/2}$ or less and a surface tension of 29.0 mN/m or more and does not have a benzene ring group.

That the mixed solvent consists of only two or more kinds of organic solvents A means that the mixed solvent substantially consists of only the organic solvent A.

Specifically, it means that the total content of the two or more kinds of organic solvents A is more than 98% by mass and 100% by mass or less (preferably 99% to 100% by mass and more preferably 99.9% to 100% by mass) with respect to the total mass of the mixed solvent.

(Organic Solvent A)

The organic solvent A is an organic solvent which has an SP value and a surface tension within predetermined ranges, respectively, and does not have a benzene ring group. The organic solvent A is not particularly limited as long as it is an organic solvent which satisfies the above requirements and by which the physical properties of the finally obtained pre-wet liquid can be made to meet the above-described conditions.

The surface tension of the organic solvent A is 29.0 mN/m or more, preferably 29.5 to 50.0 mN/m, and more preferably 30.0 to 40.0 mN/m.

The viscosity of the organic solvent A is preferably 2.5 cP or less and more preferably 2.0 cP or less. The lower limit thereof is not particularly limited, and it is, for example, 0.1 cP or more.

The vapor pressure of the organic solvent A is preferably 0.3 to 8.0 mmHg and more preferably 0.5 to 5.8 mmHg.

The SP value of the organic solvent A is 25.0 $MPa^{1/2}$ or less, preferably 10.0 to 25.0 $MPa^{1/2}$, and more preferably 18.0 to 24.0 $MPa^{1/2}$.

The boiling point of the organic solvent A is preferably 100° C. to 250° C. and more preferably 120° C. to 200° C.

The molecular weight of the organic solvent A is preferably 60 to 500 and more preferably 80 to 250.

The organic solvent A does not have a benzene ring group. In a case where the organic solvent A has benzene ring groups, the surface tension of the pre-wet liquid tends to increase since the benzene ring groups interact more strongly due to the π-π electron interaction; however, on the other hand, the benzene ring groups easily interact with the solid content (the photoacid generator and the like) in the resist composition to cause coating unevenness, and thus the desired effect cannot be obtained.

The benzene ring group which is not contained in the organic solvent A is intended to include not only a benzene ring group that is present in a monocyclic state but also, for example, a benzene ring group in a polycycle in which the benzene ring group is present as a partial structure in a naphthalene ring group.

It is also preferable that the organic solvent A has an ester group (—CO—O—, both ends of which are bonded to carbon atoms).

In addition, it is also preferable that the organic solvent A has one or more (preferably 2 or more and more preferably 2 to 5) carbonyl groups. The carbonyl group may be a carbonyl group of a form that is contained in the ester group.

The mixed solvent that satisfies the requirement 1 is a mixture of two or more kinds (preferably 2 to 5 kinds and more preferably 2 kinds) of organic solvents A. Among the mixed solvents that satisfy the requirement 1, the content of the organic solvent A having the highest content is preferably 20% to 98% by mass, more preferably 50% to 95% by mass, and still more preferably 50% to 90% by mass with respect to the total mass of the mixed solvent.

Among the mixed solvents that satisfy the requirement 1, the content of the organic solvent A having the second highest content is preferably 2% to 50% by mass, more preferably 5% to 50% by mass, and still more preferably 10% to 50% by mass with respect to the total mass of the mixed solvent.

The content of the organic solvent A having the highest content may be substantially the same as the content of each organic solvent A having the second highest content or lower.

As the organic solvent A, an organic solvent (ethyl pyruvate or the like) that singly satisfies each of the above-described conditions regarding the physical properties (surface tension and the like) of the pre-wet liquid may be used, or another organic solvent may be used.

As the organic solvent A, it is possible to use, for example, an organic solvent selected from the group consisting of ethyl pyruvate, methyl pyruvate, methyl acetoacetate, methyl methoxyacetate, acetyl acetone, dimethyl malonate, methyl 3-methoxypropionate, diethyl oxalate, ethyl 2-methylacetoacetate, acetonyl acetone, 1,2-diacetoxypropane, cyclohexanone, and 2-methoxy-1,3 dioxolane.

Among the above, the organic solvent A is preferably an organic solvent selected from the group consisting of ethyl pyruvate, methyl pyruvate, methyl acetoacetate, methyl methoxyacetate, acetyl acetone, dimethyl malonate, methyl 3-methoxypropionate, diethyl oxalate, ethyl 2-methylacetoacetate, acetonyl acetone, and 1,2-diacetoxypropane.

Examples of the combination of two or more kinds of organic solvents A include a combination of ethyl pyruvate and methyl 3-methoxypropionate, a combination of ethyl pyruvate and methyl pyruvate, a combination of methyl 3-methoxypropionate and methyl pyruvate, a combination of dimethyl malonate and methyl pyruvate, a combination of dimethyl malonate and methyl methoxyacetate, and a combination of ethyl 2-methylacetoacetate and methyl pyruvate. A different organic solvent A may be further combined with these combinations, as desired.

<Mixed Solvent That Satisfies Requirement 2>

The mixed solvent may be a mixed solvent that satisfies the following requirement 2.

requirement 2: the mixed solvent is a mixed solvent of the organic solvent A and an organic solvent B, and the organic solvent B is an organic solvent which has an SP value of 25.0 $MPa^{1/2}$ or less and a surface tension of less than 29.0 mN/m.

That the mixed solvent is a mixed solvent of the organic solvent A and the organic solvent B means that the mixed solvent substantially consists of only the organic solvent A and the organic solvent B.

Specifically, it means that the total content of the organic solvent A and the organic solvent B is more than 98% by mass and 100% by mass or less (preferably 99% to 100% by mass and more preferably 99.9% to 100% by mass) with respect to the total mass of the mixed solvent.

Further, in the mixed solvent that satisfies the requirement 2, the mass ratio of the content of the organic solvent A to the mass ratio of the organic solvent B (the total content mass of the organic solvent A/the total content mass of the organic solvent B) is preferably 2/98 to 98/2 and more preferably 5/95 to 95/5.

(Organic Solvent A)

The organic solvent A in the mixed solvent that satisfies the requirement 2 is the same as the organic solvent A in the mixed solvent that satisfies the requirement 1.

The organic solvent A in the mixed solvent, which satisfies the requirement 2, may be used singly or in a combination of two or more kinds thereof. Among the mixed solvents that satisfy the requirement 2, the content of the organic solvent A having the highest content is preferably 20% to 100% by mass, more preferably 50% to 100% by mass, and still more preferably 80% to 100% by mass with respect to the total mass of the organic solvent A.

(Organic Solvent B)

The organic solvent B is an organic solvent which has an SP value and a surface tension within predetermined ranges, respectively. The organic solvent B is not particularly limited as long as it is an organic solvent which satisfies the above requirements and by which the physical properties of the finally obtained pre-wet liquid can be made to meet the above-described conditions.

The surface tension of the organic solvent B is less than 29.0 mN/m, preferably 10.0 mN/m or more and less than 29.0 mN/m, more preferably 20.0 mN/m or more and less than 29.0 mN/m, and still more preferably 23.0 to 28.5 mN/m.

The viscosity of the organic solvent B is preferably 2.5 cP or less, more preferably 2.0 cP or less, and still more preferably 1.4 cP or less. The lower limit thereof is not particularly limited, and it is, for example, 0.1 cP or more.

The vapor pressure of the organic solvent B is preferably 0.3 to 13.0 mmHg and more preferably 1.0 to 8.0 mmHg.

The SP value of the organic solvent B is 25.0 $MPa^{1/2}$ or less, preferably 10.0 to 25.0 $MPa^{1/2}$, and more preferably 15.0 to 23.0 $MPa^{1/2}$.

The boiling point of the organic solvent B is preferably 80° C. to 250° C. and more preferably 100° C. to 200° C.

The molecular weight of the organic solvent B is preferably 40 to 500 and more preferably 70 to 250.

The organic solvent B may have or may not have a benzene ring group. The benzene ring group referred to herein is intended to include not only a benzene ring group that is present in a monocyclic state but also, for example, a benzene ring group in a polycycle in which the benzene ring group is present as a partial structure in a naphthalene ring group.

As the organic solvent B, it is possible to use an organic solvent selected from the group consisting of propylene glycol monomethyl ether acetate (PGMEA), propylene glycol monomethyl ether (PGME), butyl acetate (nBA), isoamyl acetate, amyl acetate, butyl propionate, isobutyl propionate, and pentyl acetate.

Among them, the organic solvent B is preferably, for example, an organic solvent selected from the group consisting of propylene glycol monomethyl ether acetate (PGMEA), propylene glycol monomethyl ether (PGME), and butyl acetate (nBA).

The organic solvent B in the mixed solvent, which satisfies the requirement 2, may be used singly or in a combination of two or more kinds thereof. Among the mixed solvents that satisfy the requirement 2, the content of the organic solvent B having the highest content is preferably 20% to 100% by mass, more preferably 50% to 100% by mass, and still more preferably 80% to 100% by mass with respect to the total mass of the organic solvent B.

Examples of the combination of the organic solvent A and the organic solvent B include a combination of ethyl pyruvate and PGMEA, a combination of ethyl pyruvate and nBA, a combination of methyl 3-methoxypropionate and PGMEA, a combination of methyl 3-methoxypropionate and nBA, a combination of dimethyl malonate and nBA, and a combination of ethyl 2-methylacetoacetate and nBA.

A different organic solvent A and/or organic solvent B may be further combined with these combinations, as desired.

[Production Method for Pre-Wet Liquid]

The production method for the pre-wet liquid according to the embodiment of the present invention is not particularly limited, and a known production method can be used. Examples of the production method for the pre-wet liquid include, for example, a production method which includes a step of preparing an organic solvent (and, as desired, a step of mixing the organic solvent to obtain a mixture). A step of purifying the organic solvent and/or the mixture using a filter or the like may be further included. Further, a static elimination step of subjecting the organic solvent and/or the mixture to static eliminating to lower the electrostatic charging potential may be further included.

As the organic solvent that is used in the production of the pre-wet liquid, it is preferable to prepare a solvent having a low content of impurities. Examples of the commercially available product of such an organic solvent include a product called "high-purity grade product".

Examples of the method of purifying the organic solvent and/or the mixture include methods such as distillation and filtration. As the distillation device and the filtering device, known ones can be used.

<Container>

The pre-wet liquid may be temporarily stored in a container until use. The container for storing the pre-wet liquid is not particularly limited, and a known container can be used.

The container for storing the pre-wet liquid is preferably a container for manufacturing a semiconductor, which has high internal cleanliness and hardly causes elution of impurities.

Specific examples of the usable containers include, but not limited to, "CLEAN Bottle" series manufactured by AICELLO CORPORATION and "Pure Bottle" manufactured by KODAMA PLASTICS Co., Ltd.

In addition, as the container, it is preferable to use a container of which the interior wall has a 6-layer structure of 6 kinds of resins or a 7-layer structure of 6 kinds of resins, for the intended purpose of preventing impurities from being incorporated (contaminated) in the pre-wet liquid. Examples of the above container include the container disclosed in JP2015-123351A.

The liquid contact portion of this container is preferably formed of a non-metal material or stainless steel.

Examples of the non-metal material include the material exemplified in the non-metal material that is used in the liquid contact portion of the distillation column described above.

In particular, among the above, in a case of using a container of which the liquid contact portion is a fluorine resin, it is possible to suppress the occurrence of a problem of elution of ethylene or propylene oligomers, as compared with a case of using a container of which the liquid contact portion is a polyethylene resin, a polypropylene resin, or a polyethylene-polypropylene resin.

Specific examples of such a container of which the liquid contact portion is a fluorine resin include a FluoroPure PFA composite drum manufactured by Entegris Inc. In addition, it is also possible to use the containers described on page 4 of JP1991-502677A (JP-H3-502677A), page 3 of WO2004/016526A, pages 9 and 16 of the WO99/46309A, and the like. In a case where the non-metal material is used as a liquid contact portion, it is preferable that the elution of the non-metal material into the pre-wet liquid is suppressed.

The container is preferably a container of which the liquid contact portion in contact with the pre-wet liquid is formed of stainless steel and more preferably a container thereof is formed of electrolytically polished stainless steel.

In a case where the pre-wet liquid is accommodated in the container, impurity metals and/or organic impurities hardly elute into the pre-wet liquid stored in the container.

The form of the above-described stainless steel is as described above as the material of the liquid contact portion of the distillation column. In addition, the same applies to electrolytically polished stainless steel.

The content mass ratio (hereinafter, also referred to as "Cr/Fe") of the Cr atom content to the Fe atom content in the stainless steel that forms the liquid contact portion of the container is not particularly limited. However, in general, it is preferably 0.5 to 4, and it is more preferably more than 0.5 and less than 3.5 in that impurity metals and/or organic impurities elute into the pre-wet liquid stored in the container. In a case where Cr/Fe is more than 0.5, the metal elution from the inside of the container can be suppressed, and the peeling of the inner container, which causes the generation of particles, hardly occurs in a case where Cr/Fe is less than 3.5.

The method of adjusting Cr/Fe in the stainless steel is not particularly limited, and examples thereof include a method of adjusting the Cr atom content in the stainless steel and a method of making the chromium content in a passive layer on the polished surface due to electrolytic polishing higher than the chromium content in the parent phase.

In the container, the device that is used in the production of the pre-wet liquid, and the member (a filter or and the like) that is used for the production of the pre-wet liquid, the portions (the interior wall of the container, the interior wall of the device, the inside of the member, and the like; hereinafter also referred to as the "liquid contact portions") that are in contact with the pre-wet liquid are preferably washed before use. The liquid that is used for washing is preferably a washing liquid having few impurities, and it is preferably, for example, the above-described "high-purity grade product", a liquid obtained by purifying the high-purity grade product, the pre-wet liquid itself, a liquid obtained by diluting the pre-wet liquid, or the like. Further, in a case of washing the liquid contact portion of the device that is used in the production of the pre-wet liquid with the washing liquid, it is preferable to carry out washing until the impurities contained in the washing liquid by washing are less than a desired amount (a predetermined value). After the production, the above pre-wet liquid may be bottled in a container such as a gallon bottle or a quart bottle, and it may be transported and stored. A glass material may be used for the gallon bottle, or a material other than the glass material may be used.

In order to prevent changes in the components of the solution during storage, the inside of the container may be replaced with an inert gas (such as nitrogen or argon) having a purity of 99.99995% by volume or higher. In particular, a gas having a low moisture content is preferable. Although the pre-wet liquid may be transported and stored at normal temperature, the temperature may be controlled in a range of −20° C. to 30° C. in order to prevent deterioration.

(Clean Room)

It is preferable that all of the handlings including the production of the pre-wet liquid, the opening and/or washing of the container, the accommodation of the solution, and the like, the treatment analysis, and the measurement are carried out in the clean room. The clean room preferably satisfies 14644-1 clean room criteria. The clean room preferably satisfies any of International Organization for Standardization (ISO) class 1, ISO class 2, ISO class 3, and ISO class 4; more preferably satisfies ISO class 1 or ISO class 2; and still more preferably satisfies ISO class 1.

<Chemical Liquid Storage Body>

The chemical liquid storage body is preferably a chemical liquid storage body which includes a container and the pre-wet liquid accommodated in the container and of which the liquid contact portion in contact with the pre-wet liquid inside the container is formed of a non-metal material or stainless steel.

The non-metal material is not particularly limited; however, it is preferably at least one selected from the group consisting of a polyethylene resin, a polypropylene resin, a polyethylene-polypropylene resin, a tetrafluoroethylene resin, a tetrafluoroethylene-perfluoroalkyl vinyl ether copolymer, a tetrafluoroethylene-hexafluoropropylene copolymer resin, a tetrafluoroethylene-ethylene copolymer resin, a trifluorochloroethylene-ethylene copolymer resin, a fluorovinylidene resin, a trifluorochloroethylene copolymer resin, and a fluorovinyl resin. In the chemical liquid storage body which is formed of the non-metal material described above, impurity metals and/or organic impurities hardly elute into the pre-wet liquid during the long-term storage.

The stainless steel is not particularly limited, and a known stainless steel can be used. The form of the stainless steel is as described above as the liquid contact portion of the container.

[Resist Film Forming Method and Pattern Forming Method]

It is preferable that the pre-wet liquid is used in the formation of a resist film and/or a resist pattern (hereinafter, simply also referred to as a "pattern"), which are used for manufacturing a semiconductor. The resist film forming method and the pattern forming method, using the pre-wet liquid, are not particularly limited, and examples thereof include a known resist film forming method and a pattern forming method.

Among them, the resist film forming method is preferably a method including the following steps (A) and (B). The pattern forming method preferably includes each of the following steps.

(A) the pre-wetting step of applying the above pre-wet liquid onto a substrate (B) the resist film forming step of forming a resist film onto the substrate after the pre-wetting step, by using a resist composition (generally, by applying the resist composition).

(C) the exposure step of exposing the resist film (D) the development step of developing the exposed resist film by using a developing liquid Hereinafter, the aspect of each of the above steps will be described.

[(A) Pre-Wetting Step]

The pre-wetting step is a step of applying the pre-wet liquid onto the substrate.

The substrate is not particularly limited, and a known substrate that is used for manufacturing a semiconductor can be used. Examples of the substrate include an inorganic substrate such as silicon, $SiO_2$, or SiN, a coating-type inorganic substrate such as Spin On Glass (SOG), and the like, but the substrate is not limited to these.

In addition, the substrate may be an antireflection film-attached substrate which includes an antireflection film. The antireflection film is not particularly limited, and a known organic or inorganic antireflection film can be used.

The method of applying the pre-wet liquid onto the substrate is not particularly limited, and a known application method can be used. Among the above, the application method is preferably spin coating in that it is possible to form a uniform resist film with a smaller amount of the resist composition in the resist film forming step which will be described later.

The thickness of a pre-wet liquid layer formed on the substrate by using the pre-wet liquid is not particularly limited; however, in general, it is preferably 0.001 to 10 μm and more preferably 0.005 to 5 μm.

Here, the surface tension of the pre-wet liquid is preferably higher than the surface tension of the resist composition to be applied.

In general, the pre-wet liquid is supplied to the wafer by a method of moving a pre-wet nozzle to a position above the central part of the wafer. Then, the pre-wet liquid is supplied to the wafer by opening and closing the valve.

In a state where the wafer stands still, a predetermined amount of the pre-wet liquid is supplied to the central part of the wafer from the pre-wet nozzle. Then, the wafer is rotated at a first speed V1 which is, for example, about 500 rotations per minute (rpm), and the pre-wet liquid on the wafer spreads over the entire surface of the wafer, whereby the entire surface of the wafer is in a state of being wetted with the pre-wet liquid.

The upper limit value of the first speed V1 is not particularly limited; however, it is preferably 3,000 rpm or less.

Then, the valve of a line connected to a resist composition is opened. As a result, the resist composition starts to be discharged from a resist nozzle, and the resist composition starts to be supplied to the central part of the wafer.

The resist composition may be a resist composition for ArF exposure, may be a resist composition for EUV exposure, or may be a resist composition for KrF exposure. That is, the pre-wet liquid may be a pre-wet liquid that is used by being applied onto a substrate onto which a resist composition for ArF exposure is applied, may be a pre-wet liquid that is used by being applied onto a substrate onto which a resist composition for EUV exposure is applied, or may be a pre-wet liquid that is used by being applied onto a substrate onto which a resist composition for KrF exposure is applied.

In this way, (B) the resist film forming step (described later) is started. In the resist film forming step, the rotation speed of the wafer is increased from the first speed V1 to the second speed V2 of about 2,000 to 4,000 rpm. The rotation of the wafer at the first speed V1 before the start of the resist film forming step is then gradually accelerated so that the speed continuously and smoothly changes. At this time, the acceleration of the rotation of the wafer is gradually increased, for example, from zero. At the time of the completion of the resist film forming step, the acceleration of the rotation of the wafer is reduced so that the rotation speed of the wafer smoothly reaches the second speed V2. In this way, during the resist film forming step, the rotation speed of the wafer changes so that the transition from the first speed V1 to the second speed V2 proceeds according to an S-shaped curve. In the resist film forming step, due to the centrifugal force, the resist composition supplied to the central part of the wafer spreads over the entire surface of the wafer, whereby the surface of the wafer is coated with the resist composition.

The technique for saving resist by changing the rotation speed of a wafer during the resist coating is specifically described in JP2008-131495 and JP2009-279476A.

The interval between after (A) the pre-wetting step has been completed and until (B) the coating with the resist composition in the resist film forming step is to be started is not particularly limited; however, in general, it is preferably 7 seconds or less.

The pre-wet liquid may be recycled. That is, the pre-wet liquid that is used in the pre-wetting step can be recovered and reused in the pre-wetting step for other wafers.

In a case where the pre-wet liquid is recycled, it is preferable to adjust the content of the impurity metal, the organic impurities, water, and the like contained in the recovered pre-wet liquid. The method of carrying out the above adjustment is as described above as the production method for a pre-wet liquid.

[(B) Resist Film Forming Step]

The resist film forming step is a step of forming a resist film onto the substrate after the pre-wetting step, by using a resist composition (generally, by applying the resist composition).

The substrate after the pre-wetting step is a substrate having a pre-wet liquid layer, and it is also referred to as a pre-wetted substrate.

Hereinafter, first, the form of the resist composition will be described.

<Resist Composition>

The resist composition that can be used in the resist film forming step is not particularly limited, and a known resist composition can be used.

The resist composition may be, for example, for the positive tone development or the negative tone development. In addition, there is no limitation on the light with which a resist film that is formed by using a resist composition is exposed, where the resist composition may be, for example, a resist composition for ArF exposure, may be a resist composition for EUV exposure, or may be a resist composition for KrF exposure.

It is preferable that the resist composition contains a resin (hereinafter, also referred to as an "acid-decomposable resin" in the present specification), which contains a repeating unit containing a group generating a polar group (a carboxyl group, a phenolic hydroxyl group, or the like) by being decomposed under an action of an acid, and a compound (hereinafter, also called "photoacid generator" in the present specification) which generates an acid upon irradiation with actinic rays or radiation.

Among the above, the following resist compositions are preferable in that more excellent effects of the present invention are obtained.

Resist composition containing a resin represented by Formula (I) which will be described later Resist composition containing an acid-decomposable resin having a phenolic hydroxyl group which will be described later Resist composition containing a hydrophobic resin and an acid-decomposable resin, which will be described later Hereinafter, each of the components of the resist compositions will be described.

(Acid-Decomposable Resin)

In the acid-decomposable group, the polar group is protected by a group that is eliminable by an acid (an acid-eliminable group). Examples of the acid-eliminable group include $-C(R_{36})(R_{37})(R_{38})$, $-C(R_{36})(R_{37})(OR_{39})$, and $-C(R_{01})(R_{02})(OR_{39})$.

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

Examples of the acid-decomposable resin include a resin P having an acid-decomposable group represented by Formula (AI).

(AI)

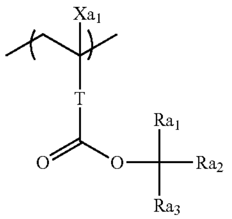

In Formula (AI), $Xa_1$ represents a hydrogen atom or an alkyl group which may have a substituent.

T represents a single bond or a divalent linking group.

$Ra_1$ to $Ra_3$ each independently represent an alkyl group (which is linear or branched) or a cycloalkyl group (which is monocyclic or polycyclic).

Two of $Ra_1$ to $Ra_3$ may be bonded to each other to form a cycloalkyl group (which is monocyclic or polycyclic).

Examples of the alkyl group which may have a substituent and represented by $Xa_1$ include a methyl group and a group represented by $-CH_2-R_{11}$. $R_{11}$ represents a halogen atom (a fluorine atom or the like), a hydroxyl group, or a monovalent organic group.

$Xa_1$ is preferably a hydrogen atom, a methyl group, a trifluoromethyl group, or a hydroxymethyl group.

Examples of the divalent linking group represented by T include an alkylene group, a —COO-Rt- group, and an —O-Rt- group. In the formulae, Rt represents an alkylene group or a cycloalkylene group.

T is preferably a single bond or a —COO-Rt- group. Rt is preferably an alkylene group having 1 to 5 carbon atoms, and it is more preferably a $-CH_2-$ group, a $-(CH_2)_2-$ group, or a $-(CH_2)_3-$ group.

The alkyl group as $Ra_1$ to $Ra_3$ preferably has 1 to 4 carbon atoms.

The cycloalkyl group as $Ra_1$ to $Ra_3$ is preferably a monocyclic cycloalkyl group such as a cyclopentyl group or a cyclohexyl group or a polycyclic cycloalkyl group such as a norbornyl group, a tetracyclodecanyl group, a tetracyclododecanyl group, or an adamantyl group.

The cycloalkyl group that is formed by the bonding of two groups of $Ra_1$ to $Ra_3$ is preferably a monocyclic cycloalkyl group such as a cyclopentyl group or a cyclohexyl group or a polycyclic cycloalkyl group such as a norbornyl group, a tetracyclodecanyl group, a tetracyclododecanyl group, or an adamantyl group. A monocyclic cycloalkyl group having 5 to 6 carbon atoms is more preferable.

In the cycloalkyl group that is formed by the bonding of two groups of $Ra_1$ to $Ra_3$, for example, one methylene group that constitutes a ring may be substituted with a heteroatom such as an oxygen atom or a group having a heteroatom such as a carbonyl group.

As the repeating unit represented by Formula (AI), for example, an aspect in which $Ra_1$ is a methyl group or an ethyl group, and $Ra_2$ and $Ra_3$ are bonded to each other to form the above-described cycloalkyl group is preferable.

Each of the above groups may have a substituent. Examples of the substituent include an alkyl group (having 1 to 4 carbon atoms), a halogen atom, a hydroxyl group, an alkoxy group (having 1 to 4 carbon atoms), a carboxy group, and an alkoxycarbonyl group (having 2 to 6 carbon atoms). The number of carbon atoms in the substituent is preferably 8 or less.

The total content of the repeating unit represented by Formula (AI) is preferably 20% to 90% by mole, more preferably 25% to 85% by mole, and still more preferably 30% to 80% by mole, with respect to all the repeating units in the resin P.

Specific examples of the repeating unit represented by Formula (AI) will be shown below, which are not limited thereto.

In the specific examples, Rx and $Xa_1$ each independently represent a hydrogen atom, $CH_3$, $CF_3$, or $CH_2OH$. Rxa and Rxb each represent an alkyl group having 1 to 4 carbon atoms. Z represents a substituent containing a polar group. In a case where a plurality of Z's are present, Z's are each independent from each other. p represents 0 or a positive integer. Examples of the substituent represented by Z containing a polar group include a hydroxyl group, a cyano group, an amino group, an alkyl amide group, a sulfonamide group, and a linear or branched alkyl group or cycloalkyl group having these groups.

1

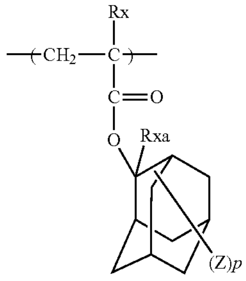

2

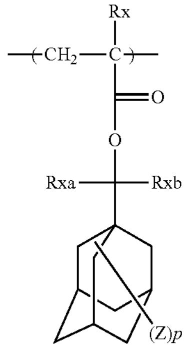

-continued

3

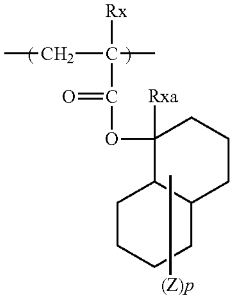

4

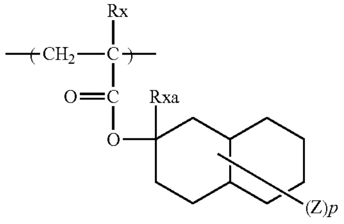

5

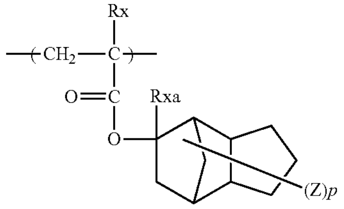

6

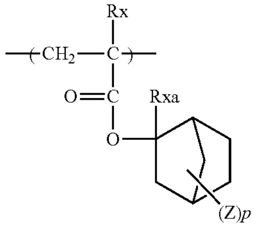

7

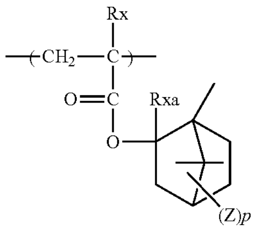

8

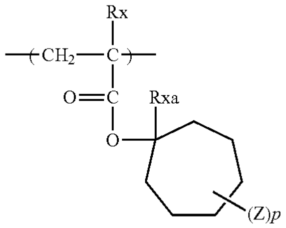

-continued

9

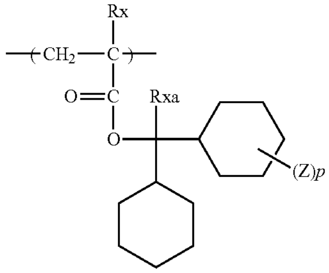

10

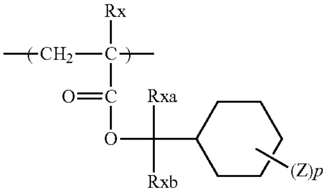

11

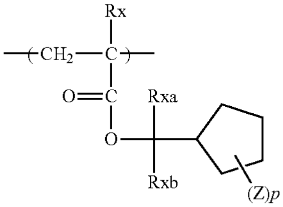

12

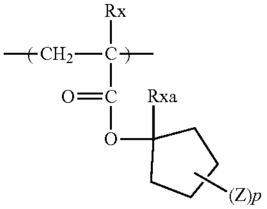

13

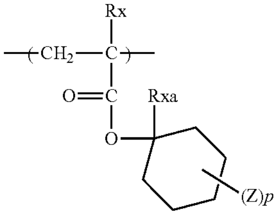

14

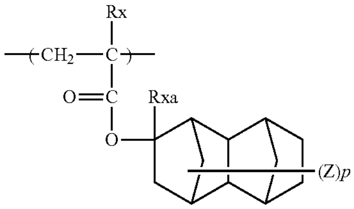

15

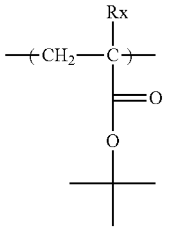

-continued

16

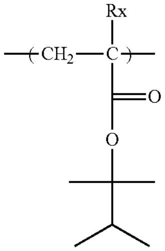

17

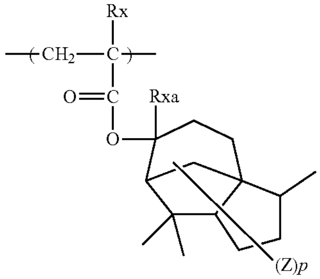

18

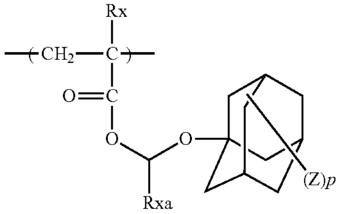

19

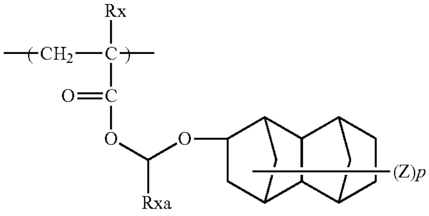

20

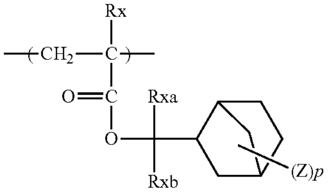

(Repeating Unit Having Lactone Structure)

It is preferable that the resin P contains a repeating unit Q having a lactone structure.

The repeating unit Q having a lactone structure preferably has a lactone structure on a side chain. For example, it is more preferably a repeating unit derived from a (meth) acrylic acid derivative monomer.

One kind of repeating unit Q having a lactone structure may be used singly, or two or more kinds thereof may be used in combination; however, it is preferable to use one kind thereof.

The content of the repeating unit Q having a lactone structure is, for example, 3% to 80% by mole and preferably 3% to 60% by mole with respect to all the repeating units in the resin P.

The lactone structure is preferably a 5- to 7-membered lactone structure, and more preferably a structure in which another ring structure is fused with a 5- to 7-membered lactone structure by forming a bicyclo structure or a Spiro structure.

It is preferable that the lactone structure have a repeating unit having a lactone structure represented by any one of Formulae (LC1-1) to (LC1-17). The lactone structure is preferably a lactone structure represented by Formula (LC1-1), Formula (LC1-4), Formula (LC1-5), or Formula (LC1-8), and it is more preferably a lactone structure represented by Formula (LC1-4).

LC1-1

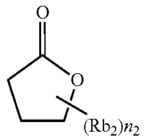

LC1-2

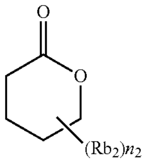

LC1-3

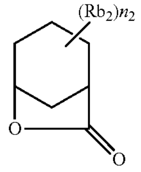

LC1-4

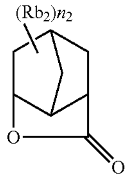

LC1-5

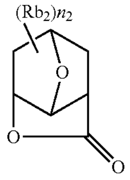

LC1-6

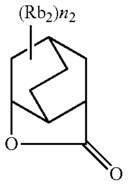

LC1-7

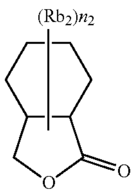

-continued

LC1-8

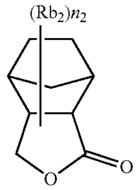

LC1-9

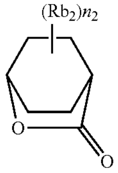

LC1-10

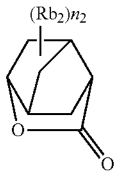

LC1-11

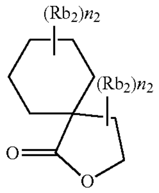

LC1-12

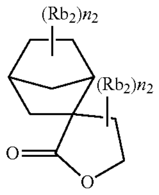

LC1-13

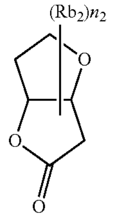

LC1-14

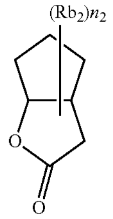

LC1-15

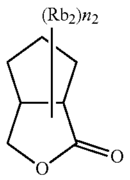

-continued

LC1-16

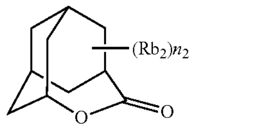

LC1-17

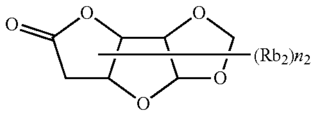

The lactone structure moiety may have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, and an acid-decomposable group. $n_2$ represents an integer of 0 to 4. In a case where $n_2$ 2 or more, a plurality of substituents ($Rb_2$) may be the same or different from each other, and a plurality of substituents ($Rb_2$) may be bonded to each other to form a ring.

The resin P is preferably a resin including a repeating unit selected from the group consisting of a repeating unit represented by Formula (a), a repeating unit represented by Formula (b), a repeating unit represented by Formula (c), a repeating unit represented by Formula (d), and a repeating unit represented by Formula (e) (hereinafter, this resin will be also referred to as a "resin represented by Formula (I)").

The resin represented by Formula (I) is a resin of which the solubility in a developing liquid, which contains an organic solvent as a main component, is reduced under an action of an acid, and it contains an acid-decomposable group. Since such resins as those represented by Formula (I) have excellent solubility in the above pre-wet liquid, and thus the above pre-wet liquid allows to easily obtain a uniform resist film by using a smaller amount of the resist composition. Hereinafter, the resin represented by Formula (I) will be described.

The resin represented by Formula (I) may be a resin substantially consisting of only the repeating units represented by Formulae (a) to (e). For example, the resin represented by Formula (I) may contain a repeating unit other than the repeating units represented by Formulae (a) to (e) in a range of 0% to 5% by mole (more preferably in a range of 0% to 1% by mole) with respect to all the repeating units of the resin.

Resin Represented by Formula (I)

(a)

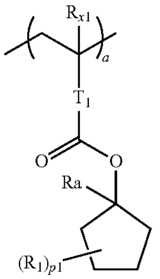

-continued (b)

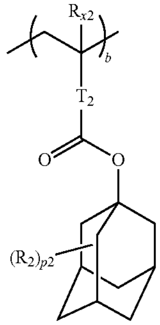

(c)

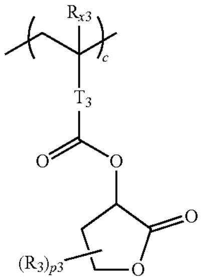

(d)

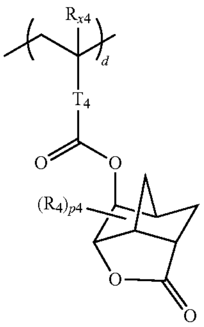

(e)

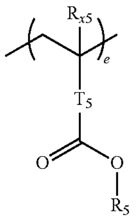

Formula (I) is constituted of a repeating unit (a) a (repeating unit represented by Formula (a)), a repeating unit (b) (a repeating unit represented by Formula (b)), a repeating unit (c) (a repeating unit represented by Formula (c)), a repeating unit (d) (a repeating unit represented by Formula (d)), and a repeating unit (e) (a repeating unit represented by Formula (e)).

$R_{x1}$ to $R_{x5}$ each independently represent a hydrogen atom or an alkyl group which may have a substituent.

$R_1$ to $R_4$ each independently represent a monovalent substituent, and $p_1$ to $p_4$ each independently represent 0 or a positive integer.

$R_a$ represents a linear or branched alkyl group, $T_1$ to $T_5$ each independently represent a single bond or a divalent linking group, $R_5$ represents a monovalent organic group, and a to e represent % by mole (% by mole of each repeating unit with respect to the total 100% by mole of the repeating units (a) to (e)), and they each independently represent numbers in ranges of 0≤a≤100, 0≤b≤100, 0≤c<100, 0≤d<100, and 0≤e<100, respectively, provided that a+b+c+d+e=100 is satisfied, and a+b≠0 is satisfied.

However, in Formula (I), the repeating unit (e) has a structure different from any one of the repeating units (a) to (d).

Examples of the alkyl group represented by $R_{x1}$ to $R_{x5}$ which may have a substituent include a methyl group and a group represented by $—CH_2—R_{11}$. $R_{11}$ represents a halogen atom (a fluorine atom or the like), a hydroxyl group, or a monovalent organic group.

$R_{x1}$ to $R_{x5}$ are each independently preferably a hydrogen atom, a methyl group, a trifluoromethyl group, or a hydroxymethyl group.

Examples of the divalent linking group represented by $T_1$ to $T_5$ in Formula (I) include an alkylene group, a —COO-Rt- group, and an —O-Rt- group. In the formulae, Rt represents an alkylene group or a cycloalkylene group.

$T_1$ to $T_5$ are each independently preferably a single bond or a —COO-Rt- group. Rt is preferably an alkylene group having 1 to 5 carbon atoms, and it is more preferably a $—CH_2—$ group, a $—(CH_2)_2—$ group, or a $—(CH_2)_3—$ group.

In Formula (I), $R_a$ represents a linear or branched alkyl group. Examples thereof include a methyl group, an ethyl group, and a t-butyl group. Among these, a linear or branched alkyl group having 1 to 4 carbon atoms is preferable.

In Formula (I), $R_1$ to $R_4$ each independently represent a monovalent substituent. $R_1$ to $R_4$ are not particularly limited; however, examples thereof include a hydroxyl group, a cyano group, and a linear or branched alkyl group or cycloalkyl group having a hydroxyl group, and a cyano group.

In Formula (I), $p_1$ to $p_4$ each independently represent 0 or a positive integer. The upper limit value of $p_1$ to $p_4$ corresponds to the number of hydrogen atoms in each repeating unit, which can be substituted.

In Formula (I), $R_5$ represents a monovalent organic group. $R_5$ is not particularly limited; however, examples thereof include a monovalent organic group having a sultone structure; a monovalent organic group having a cyclic ether such as tetrahydrofuran, dioxane, 1,4-thioxane, dioxolane, or 2,4,6-trioxabicyclo[3.3.0]octane; and an acid-decomposable group (for example, an adamantyl group quaternized by the substitution of carbon at a position bonded to a —COO group with an alkyl group).

The repeating unit (b) in Formula (I) is preferably formed of the monomer described in paragraphs 0014 to 0018 in JP2016-138219A.

In Formula (I), a to e represent % by mole (% by mole of each repeating unit with respect to the total 100% by mole of the repeating units (a) to (e)), and they each independently represent numbers included in ranges of 0≤a≤100, 0≤b≤100, 0≤c<100, 0≤d<100, and 0≤e<100, respectively, provided that a+b+c+d+e=100 is satisfied, and a+b≠0 is satisfied.

In Formula (I), a+b is preferably 20% to 90% by mole, more preferably 25% to 85% by mole, and still more preferably 30% to 80% by mole.

In Formula (I), the content of the repeating unit having an acid-decomposable group is preferably 20% to 90% by mole, more preferably 25% to 85% by mole, and still more preferably 30% to 80% by mole, with respect to all the repeating units.

In addition, in Formula (I), c+d (the content of the repeating unit having a lactone structure with respect to all the repeating units) is preferably 3% to 80% by mole and more preferably 3% to 60% by mole.

One kind of each of the repeating unit (a) to repeating unit (e) may be used singly, or two or more kinds of each of the repeating unit (a) to repeating unit (e) may be used in combination. In a case where two or more kinds of each of the repeating units are used in combination, the total content thereof is preferably within the above range.

In general, the weight-average molecular weight (Mw) of the resin represented by Formula (I) is preferably 1,000 to 200,000, more preferably 2,000 to 20,000, and still more preferably 3,000 to 15,000. The weight-average molecular weight is a polystyrene equivalent value that is determined by gel permeation chromatography (GPC) by using tetrahydrofuran (THF) as a developing solvent.

In addition, in the resist composition, the content of the resin represented by Formula (I) is generally preferably 30% to 99% by mass and more preferably 50% to 95% by mass based on the total solid content of the resist composition.

(Repeating Unit Having Phenolic Hydroxyl Group)

The resin P may contain a repeating unit having a phenolic hydroxyl group.

Examples of the repeating unit having a phenolic hydroxyl group include a repeating unit represented by General Formula (I).

(I)

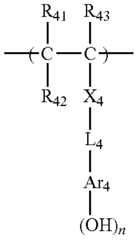

In the formulae, $R_{41}$, $R_{42}$, and $R_{43}$ each independently represent a hydrogen atom, an alkyl group, a halogen atom, a cyano group, or an alkoxycarbonyl group. However, $R_{42}$ may be bonded to $Ar_4$ to form a ring, where $R_{42}$ in such a case represents a single bond or an alkylene group.

$X_4$ represents a single bond, —COO—, or $—CONR_{64}—$, where $R_{64}$ represents a hydrogen atom or an alkyl group.

$L_4$ represents a single bond or an alkylene group.

$Ar_4$ represents an (n+1)-valent aromatic ring group, and in a case where $Ar_4$ is bonded to $R_{42}$ to form a ring, $Ar_4$ represents an (n+2)-valent aromatic ring group.

n represents an integer of 1 to 5.

The alkyl group represented by $R_{41}$, $R_{42}$, and $R_{43}$ in General Formula (I) is preferably an alkyl group having 20 or fewer carbon atoms such as a methyl group, an ethyl group, a propyl group, an isopropyl group, an n-butyl group, a sec-butyl group, a hexyl group, a 2-ethylhexyl group, an octyl group, or a dodecyl group, which may have a substituent, more preferably an alkyl group having 8 or fewer carbon atoms, and still more preferably an alkyl group having 3 or fewer carbon atoms.

The cycloalkyl group of each of $R_{41}$, $R_{42}$, and $R_{43}$ in General Formula (I) may be monocyclic or polycyclic. The cycloalkyl group is preferably a monocyclic cycloalkyl group having 3 to 8 carbon atoms such as a cyclopropyl group, a cyclopentyl group, or a cyclohexyl group, which may have a substituent.

Examples of the halogen atom of each of $R_{41}$, $R_{42}$, and $R_{43}$ in General Formula (I) include a fluorine atom, a chlorine atom, a bromine atom, and an iodine atom, and a fluorine atom is preferable.

The alkyl group contained in the alkoxycarbonyl group of each of $R_{41}$, $R_{42}$, and $R_{43}$ in General Formula (I) is preferably the same one as the alkyl group in each of $R_{41}$, $R_{42}$, and $R_{43}$.

Examples of the substituent in each of the above groups include an alkyl group, a cycloalkyl group, an awl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, and a nitro group. The number of carbon atoms in the substituent is preferably 8 or less.

$Ar_4$ represents an (n+1)-valent aromatic ring group. The divalent aromatic ring group in a case where n is 1 may have a substituent, and examples thereof include arylene groups having 6 to 18 carbon atoms such as a phenylene group, a tolylene group, a naphthylene group, and an anthracenylene group; and aromatic ring groups containing a heterocyclic ring such as thiophene, furan, pyrrole, benzothiophene, benzofuran, benzopyrrole, triazine, imidazole, benzimidazole, triazole, thiadiazole, or thiazole.

Specific examples of the (n+1)-valent aromatic ring group in a case where n is an integer of 2 or more include groups obtained by removing any (n−1) hydrogen atoms from the above-described specific examples of the divalent aromatic ring group.

The (n+1)-valent aromatic ring group may further have a substituent.

Examples of the substituent which can be contained in the alkyl group, the cycloalkyl group, the alkoxycarbonyl group, the alkylene group, and the (n+1)-valent aromatic ring group, which are described as above, include the alkyl group mentioned for $R_{41}$, $R_{42}$, and $R_{43}$ in General Formula (I); alkoxy groups such as a methoxy group, an ethoxy group, a hydroxyethoxy group, a propoxy group, a hydroxypropoxy group, and a butoxy group; aryl groups such as a phenyl group.

Examples of the alkyl group represented by $R_{64}$ in —$CONR_{64}$— ($R_{64}$ represents a hydrogen atom or an alkyl group) represented by $X_4$ include an alkyl group having 20 or fewer carbon atoms such as a methyl group, an ethyl group, a propyl group, an isopropyl group, an n-butyl group, a sec-butyl group, a hexyl group, a 2-ethylhexyl group, an octyl group, or a dodecyl group, which may have a substituent. An alkyl group having 8 or fewer carbon atoms is more preferable.

$X_4$ is preferably a single bond, —COO—, or —CONH—, and a single bond or —COO— is more preferable.

The alkylene group represented by $L_4$ is preferably an alkylene group having 1 to 8 carbon atoms such as a methylene group, an ethylene group, a propylene group, a butylene group, a hexylene group, or an octylene group, which may have a substituent.

$Ar_4$ is preferably an aromatic ring group having 6 to 18 carbon atoms, which may have a substituent, and it is more preferably a benzene ring group, a naphthalene ring group, or a biphenylene ring group.

The repeating unit represented by General Formula (I) preferably includes a hydroxystyrene structure. That is, $Ar_4$ is preferably a benzene ring group.

The repeating unit having a phenolic hydroxyl group is preferably a repeating unit represented by General Formula (p1).

(p1)

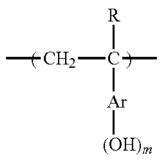

R in General Formula (p1) represents a hydrogen atom, a halogen atom, or a linear or branched alkyl group having 1 to 4 carbon atoms. A plurality of R's may be the same or different from each other. R in General Formula (p1) is preferably a hydrogen atom.

Ar in General Formula (p1) represents an aromatic ring, and examples thereof include an aromatic hydrocarbon ring having 6 to 18 carbon atoms, which may have a substituent, such as a benzene ring, a naphthalene ring, an anthracene ring, a fluorene ring, or a phenanthrene ring, and an aromatic heterocyclic ring containing a heterocyclic ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, or a thiazole ring. Among these, a benzene ring is more preferable.

m in General Formula (p1) represents an integer of 1 to 5, and it is preferably 1.

Specific examples of the repeating unit having a phenolic hydroxyl group will be shown below; however, the present invention is not limited thereto. In the formulae, a represents 1 or 2.

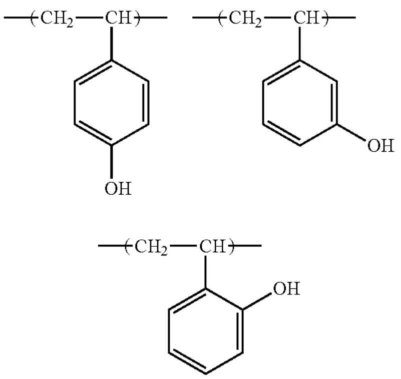

(B-1)

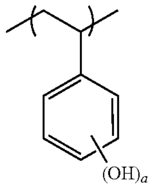

(B-2)

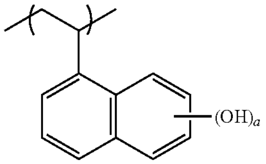

-continued
(B-3)
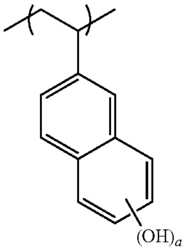
(B-4)
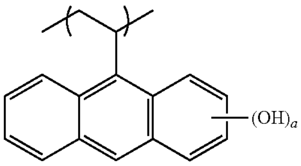
(B-5)
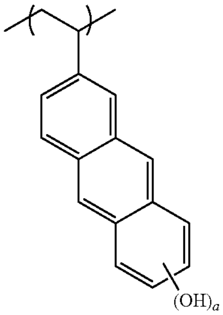
(B-6)
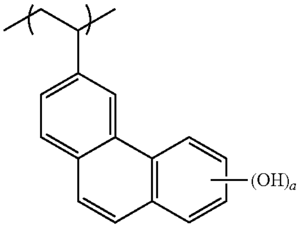
(B-7)
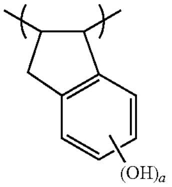
(B-8)
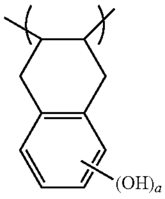
(B-9)
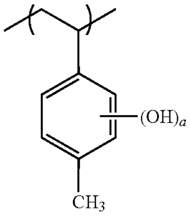
-continued
(B-10)
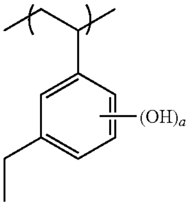
(B-11)
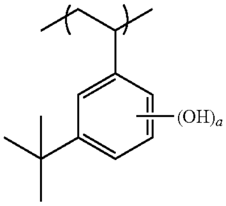
(B-12)
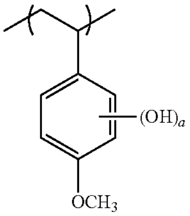
(B-13)
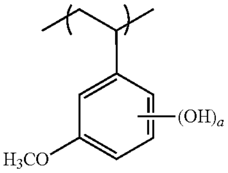
(B-14)
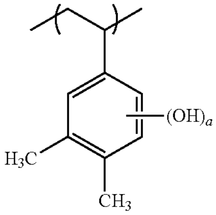
(B-15)
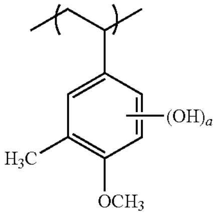
(B-16)
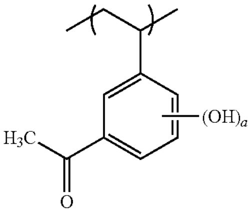

-continued
(B-17)
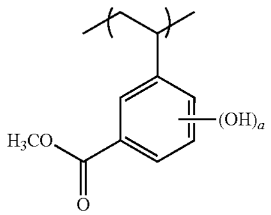
(B-18)
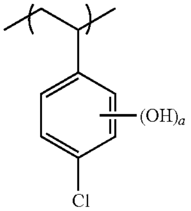
(B-19)
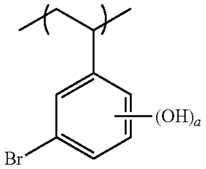
(B-20)
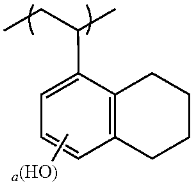
(B-21)
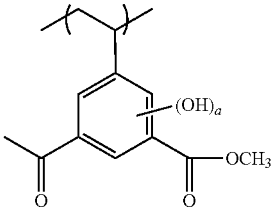
(B-22)
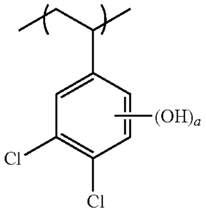
(B-23)
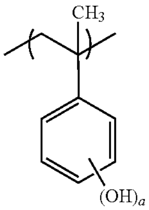
-continued
(B-24)
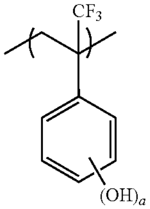
(B-25)
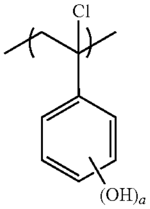
(B-26)
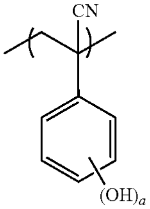
(B-27)
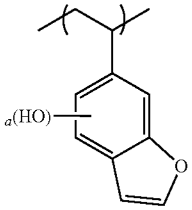
(B-28)
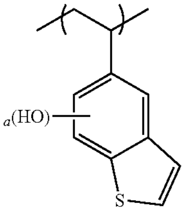
(B-29)
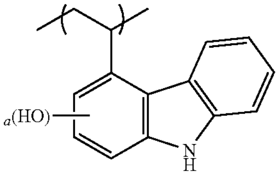
(B-30)
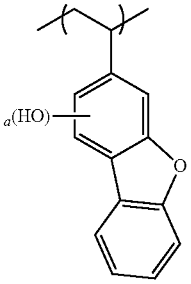

-continued (B-31)

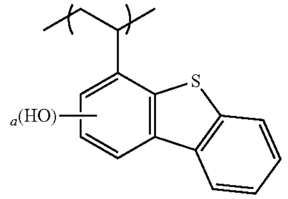

(B-32)

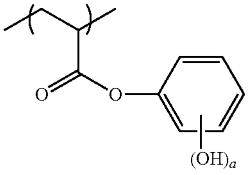

(B-33)

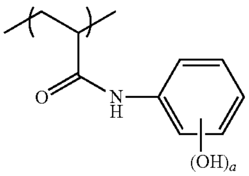

(B-34)

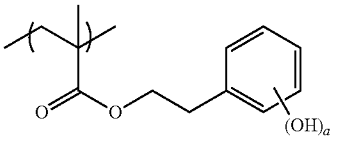

(B-35)

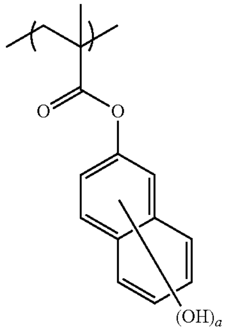

(B-36)

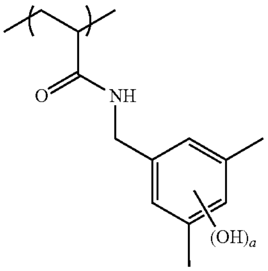

(B-37)

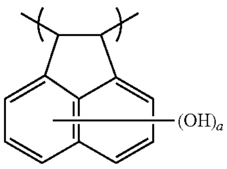

-continued (B-38)

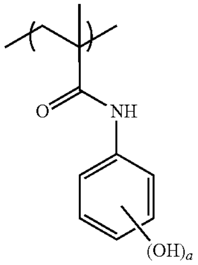

The content of the repeating unit having a phenolic hydroxyl group is preferably 0% to 50% by mole, more preferably 0% to 45% by mole, and still more preferably 0% to 40% by mole, with respect to all the repeating units in the resin P.

(Repeating Unit Containing Organic Group Having Polar Group)

The resin P may further contain a repeating unit containing an organic group having a polar group, particularly, a repeating unit having an alicyclic hydrocarbon structure substituted with a polar group.

This improves the adhesiveness to a substrate and the affinity for a developing liquid. The alicyclic hydrocarbon structure of the alicyclic hydrocarbon structure substituted with a polar group is preferably an adamantyl group, a diamantyl group, or a norbornane group. The polar group is preferably a hydroxyl group or a cyano group.

Specific examples of the repeating unit having a polar group will be shown below; however, the present invention is not limited thereto.

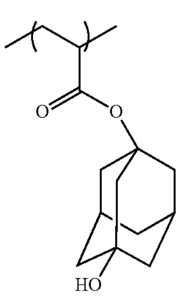

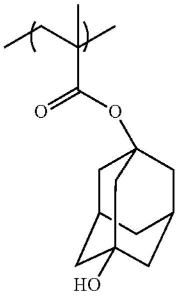

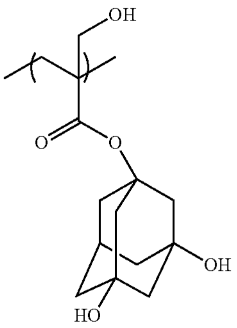

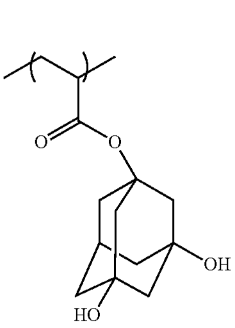

-continued

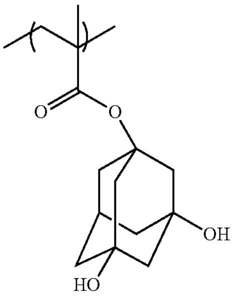

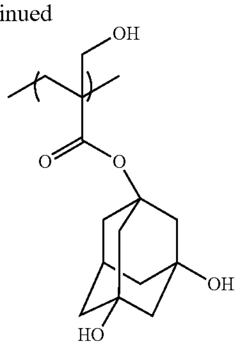

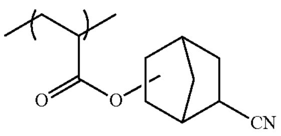

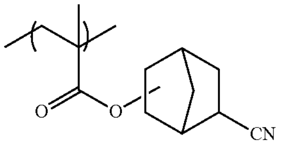

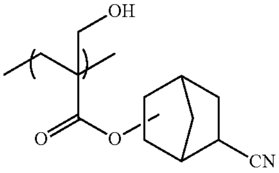

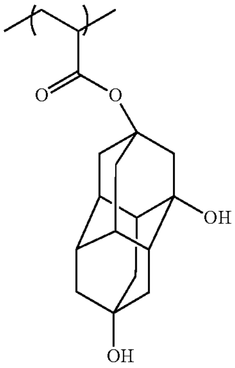

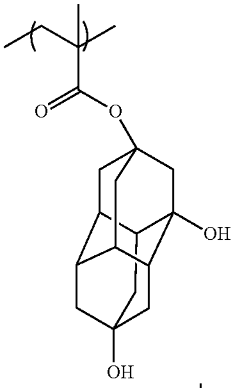

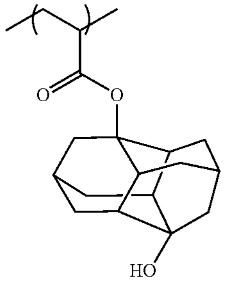

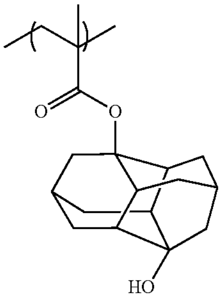

In a case where the resin P contains the repeating unit containing an organic group having a polar group, the content thereof is preferably 1% to 50% by mole, more preferably 1% to 30% by mole, still more preferably 5% to 25% by mole, and particularly preferably 5% to 20% by mole, with respect to all the repeating units in the resin P.

(Repeating Unit Having Group (Photoacid Generating Group) Which Generates Acid Upon Irradiation with Actinic Ray or Radiation)

The resin P may contain a repeating unit having a group (a photoacid generating group) which generates an acid upon irradiation with actinic rays or radiation.

Examples of the repeating unit having a group (a photoacid generating group) which generates an acid upon irradiation with actinic rays or radiation include a repeating unit represented by Formula (4).

(4)

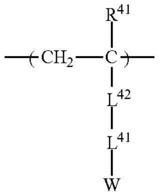

$R^{41}$ represents a hydrogen atom or a methyl group. $L^{41}$ represents a single bond or a divalent linking group. $L^{42}$ represents a divalent linking group. W represents a structural moiety that is decomposed upon irradiation with actinic rays or radiation to generate an acid in a side chain.

Specific examples of the repeating unit represented by Formula (4) will be shown below; however, the present invention is not limited thereto.

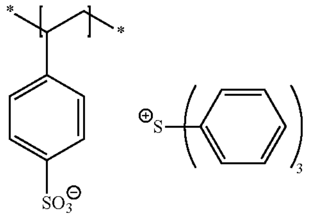

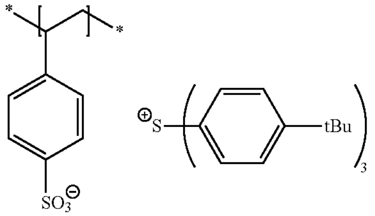

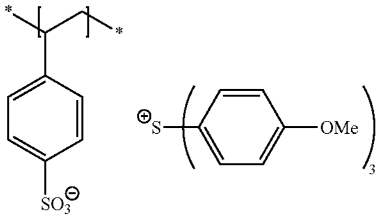

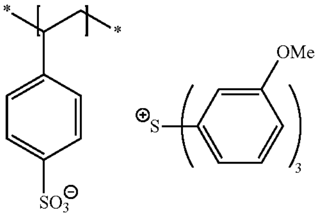

-continued
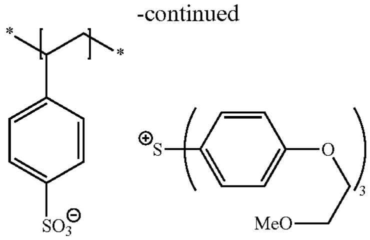
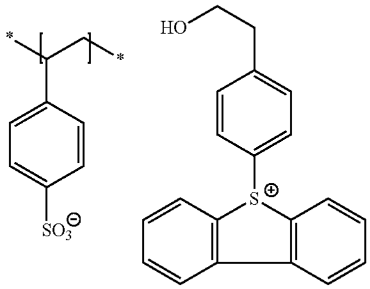
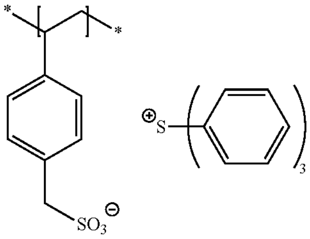
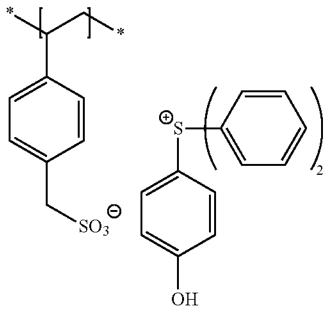
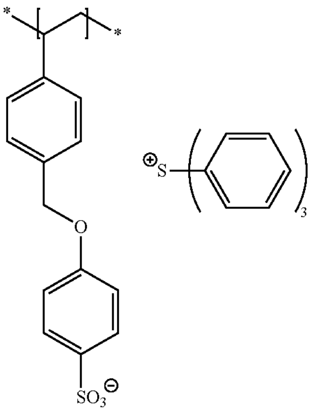
-continued
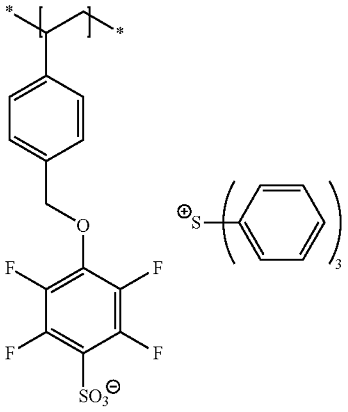
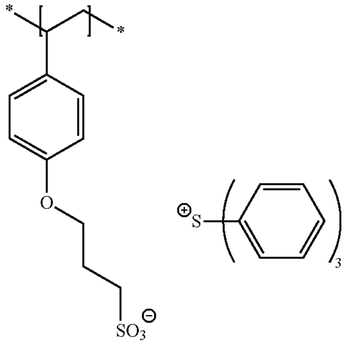
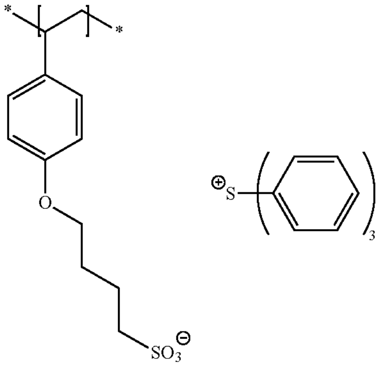
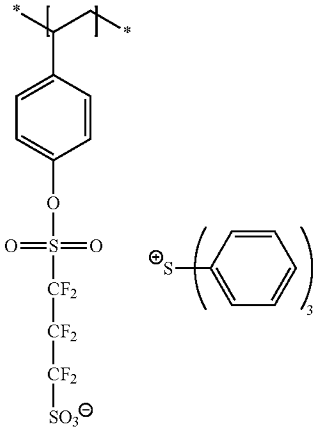

-continued

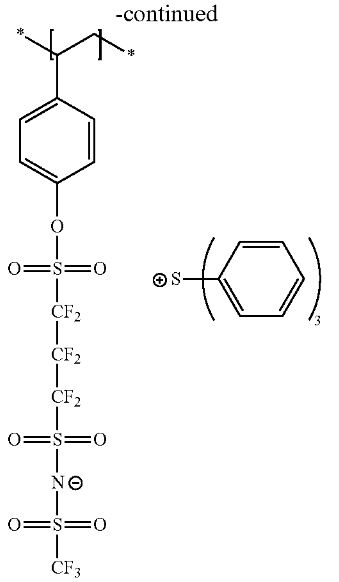

In addition, examples of the repeating unit represented by Formula (4) include the repeating units described in paragraphs [0094] to [0105] of JP2014-041327A.

In a case where the resin P contains the repeating unit having a photoacid generating group, the content of the repeating unit having a photoacid generating group is preferably 1% to 40% by mole, more preferably 5% to 35% by mole, and still more preferably 5% to 30% by mole, with respect to all the repeating units in the resin P.

The resin P may contain a repeating unit represented by Formula (VI).

(VI)

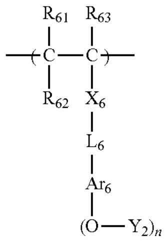

In Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. However, $R_{62}$ may be bonded to $Ar_6$ to form a ring, where $R_{62}$ in such a case represents a single bond or an alkylene group.

$X_6$ represents a single bond, —COO—, or —$CONR_{64}$—. $R_{64}$ represents a hydrogen atom or an alkyl group.

$L_6$ represents a single bond or an alkylene group.

$Ar_6$ represents an (n+1)-valent aromatic ring group, and in a case where $Ar_6$ is bonded to $R_{62}$ to form a ring, $Ar_6$ represents an (n+2)-valent aromatic ring group.

$Y_2$'s each independently represent a hydrogen atom or a group that is eliminable under an action of an acid in a case of n L≥2. However, at least one of $Y_2$'s represents a group that is eliminable under an action of an acid.

n represents an integer of 1 to 4.

The group $Y_2$ that is eliminable under an action of an acid is preferably a structure represented by Formula (VI-A).

(VI-A)

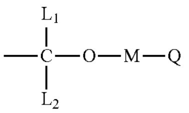

$L_1$ and $L_2$ each independently represent a hydrogen atom, an alkyl group, a cycloalkyl group, an aryl group, or a group obtained by combining an alkylene group and an aryl group.

M represents a single bond or a divalent linking group.

Q represents an alkyl group, a cycloalkyl group which may contain a heteroatom, an aryl group which may contain a heteroatom, an amino group, an ammonium group, a mercapto group, a cyano group, or an aldehyde group.

At least two of Q, M, or $L_1$ may be bonded to each other to form a ring (preferably, a 5-membered or 6-membered ring).

The repeating unit represented by Formula (VI) is preferably a repeating unit represented by Formula (3).

(3)

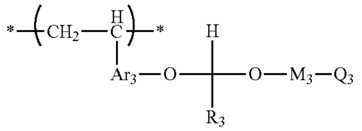

In Formula (3), $Ar_3$ represents an aromatic ring group.

$R_3$ represents a hydrogen atom, an alkyl group, a cycloalkyl group, an aryl group, an aralkyl group, an alkoxy group, an acyl group, or a heterocyclic group.

$M_3$ represents a single bond or a divalent linking group.

$Q_3$ represents an alkyl group, a cycloalkyl group, an aryl group, or a heterocyclic group.

At least two of $Q_3$, $M_3$, or $R_3$ may be bonded to each other to form a ring.

The aromatic ring group represented by $Ar_3$ is the same as $Ar_6$ in Formula (VI) in a case where n is 1. $Ar_3$ is more preferably a phenylene group or a naphthylene group and still more preferably a phenylene group.

Specific examples of the repeating unit represented by Formula (VI) will be shown below; however, the present invention is not limited thereto.

(VI-1)

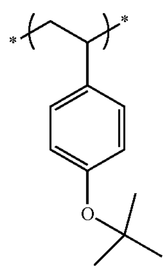

-continued
(VI-2)
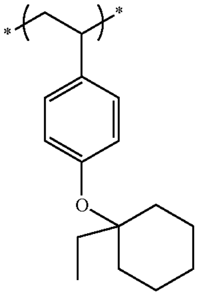
(VI-3)
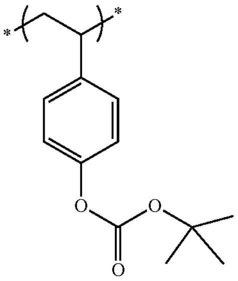
(VI-4)
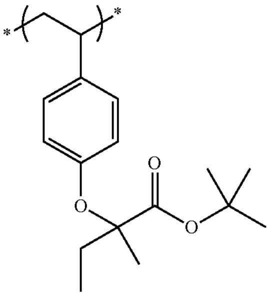
(VI-5)
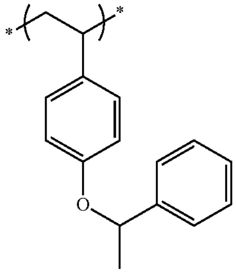
(VI-6)
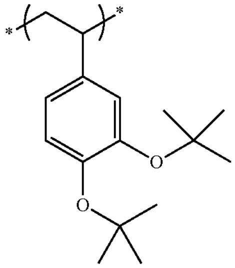
-continued
(VI-7)
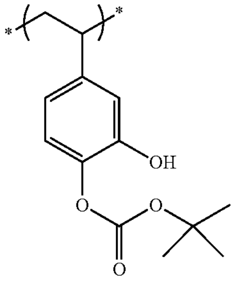
(VI-8)
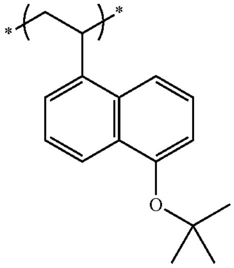
(VI-9)
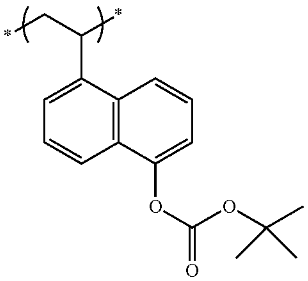
(VI-10)
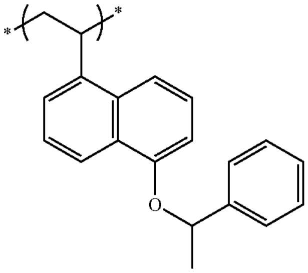
(VI-11)
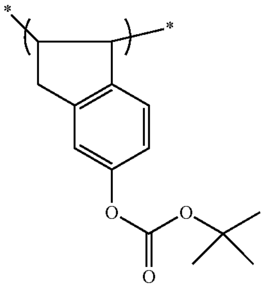

-continued
(VI-12)
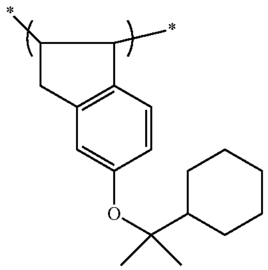
(VI-13)
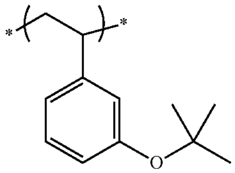
(VI-14)
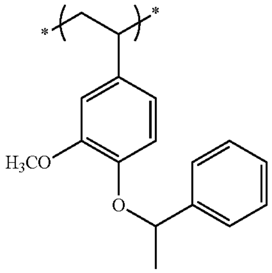
(VI-15)
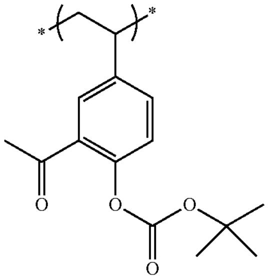
(VI-16)
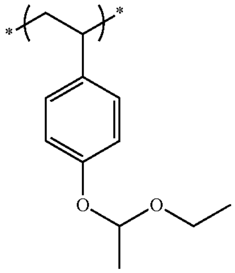
(VI-17)
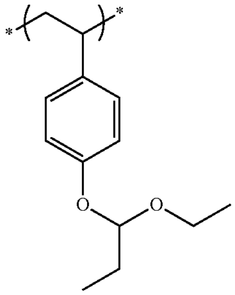
-continued
(VI-18)
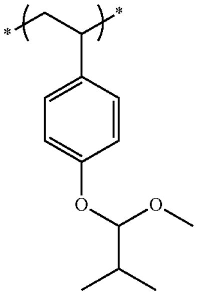
(VI-19)
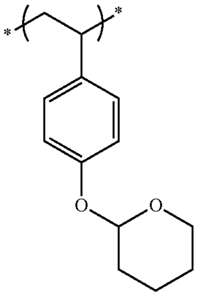
(VI-20)
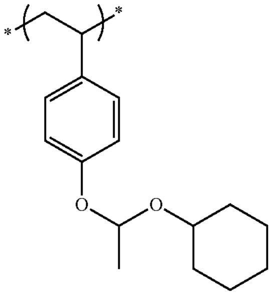
(VI-21)
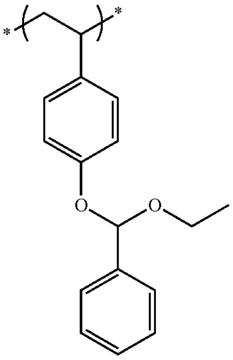
(VI-22)
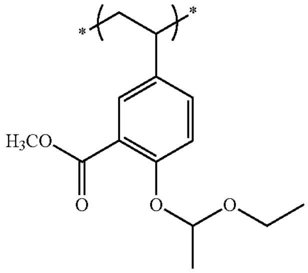

-continued
(VI-23)
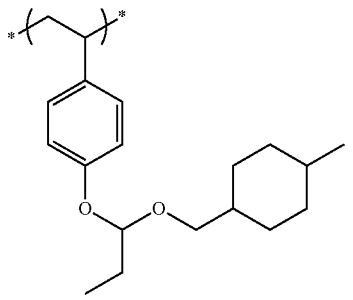
(VI-24)
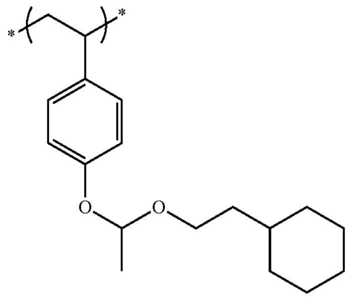
(VI-25)
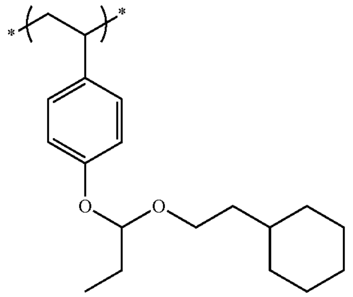
(VI-26)
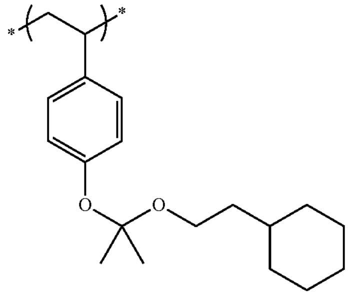
(VI-27)
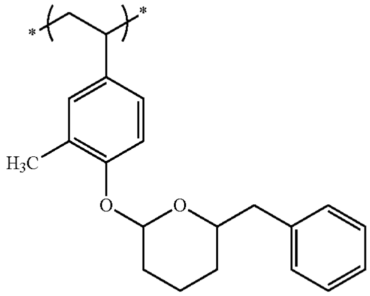
-continued
(VI-28)
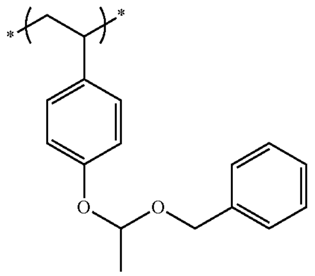
(VI-29)
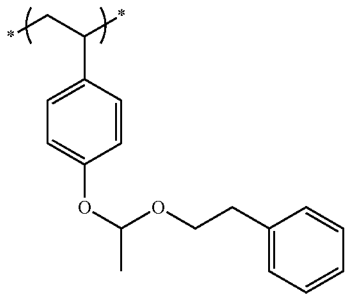
(VI-30)
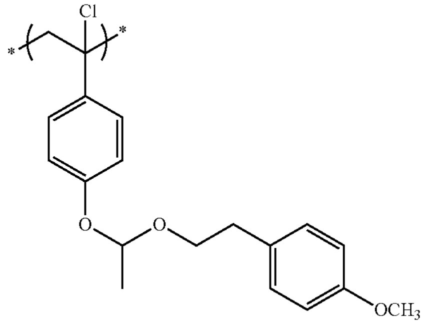
(VI-31)
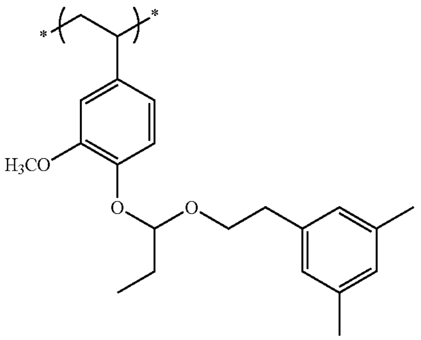
(VI-32)
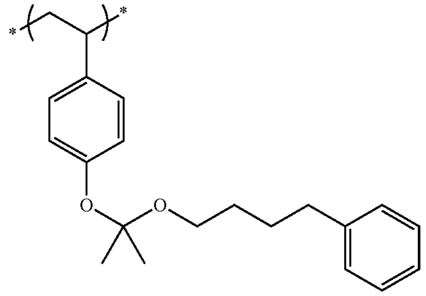

-continued (VI-33)

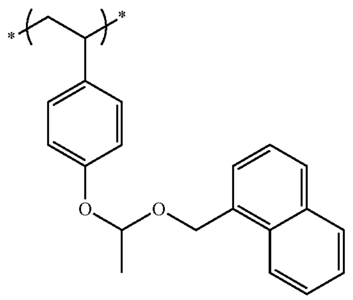

(VI-34)

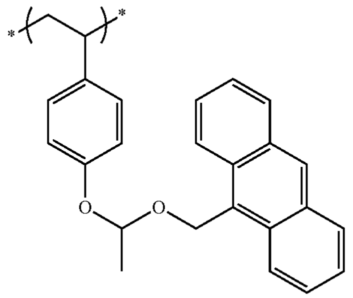

(VI-35)

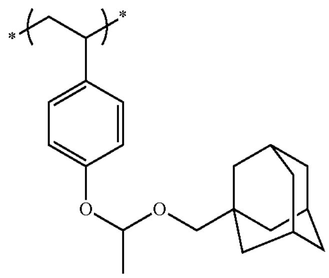

(VI-36)

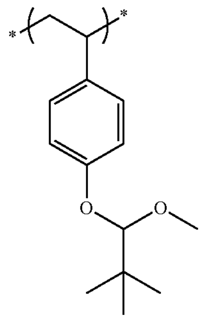

The resin P may contain a repeating unit represented by Formula (4).

(4)

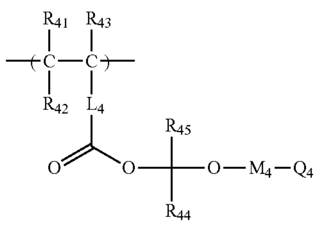

In Formula (4), $R_{41}$, $R_{42}$, and $R_{43}$ each independently represent a hydrogen atom, an alkyl group, a cycloalkyl group, a halogen atom, a cyano group, or an alkoxycarbonyl group. $R_{42}$ and $L_4$ may be bonded to each other to form a ring, where $R_{42}$ in such a case represents an alkylene group.

$L_4$ represents a single bond or a divalent linking group. In a case where $L_4$ forms a ring together with $R_{42}$, $L_4$ represents a trivalent linking group.

$R_{44}$ and $R_{45}$ each represent a hydrogen atom, an alkyl group, a cycloalkyl group, an aryl group, an aralkyl group, an alkoxy group, an acyl group, or a heterocyclic group.

$M_4$ represents a single bond or a divalent linking group.

$Q_4$ represents an alkyl group, a cycloalkyl group, an aryl group, or a heterocyclic group.

At least two of $Q_4$, $M_4$, or $R_{44}$ may be bonded to each other to form a ring.

$R_{41}$, $R_{42}$, and $R_{43}$ are respectively synonymous with $R_{41}$, $R_{42}$, and $R_{43}$ in Formula (IA), and the same applies to the preferred range thereof.

$L_4$ is synonymous with T in Formula (AI), and the same applies to the preferred range thereof.

$R_{44}$ and $R_{45}$ are synonymous with $R_3$ in Formula (3), and the same applies to the preferred range thereof.

$M_4$ is synonymous with $M_3$ in Formula (3), and the same applies to the preferred range thereof.

$Q_4$ is synonymous with $Q_3$ in Formula (3), and the same applies to the preferred range thereof.

Examples of the ring formed by the bonding of at least two of $Q_4$, $M_4$, or $R_{44}$ include a ring formed by the bonding of at least two of $Q_3$, $M_3$, or $R_3$, and the same applies to the preferred range thereof.

Specific examples of the repeating unit represented by Formula (4) will be shown below; however, the present invention is not limited thereto.

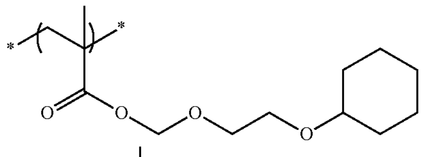

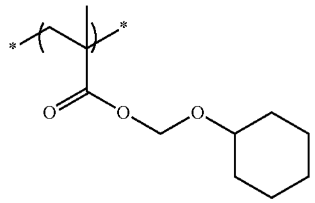

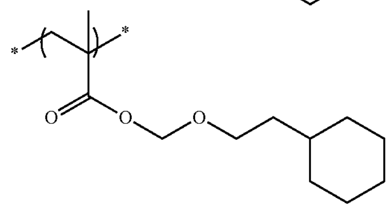

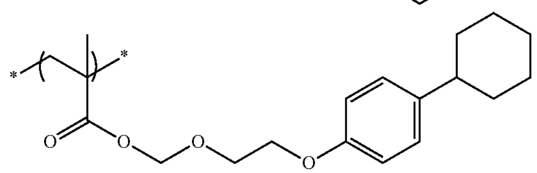

-continued

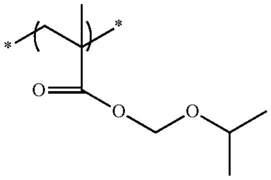

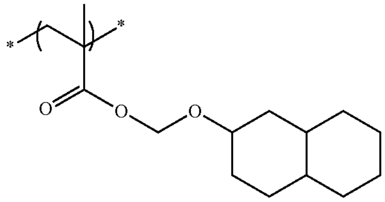

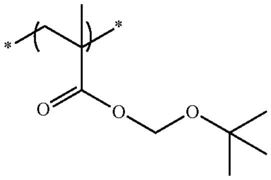

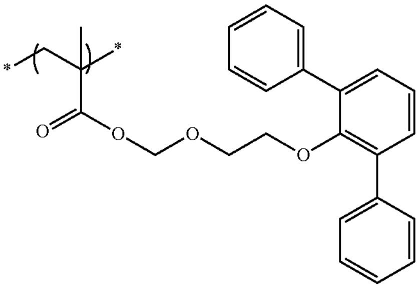

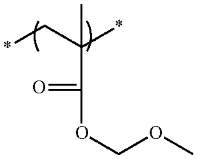

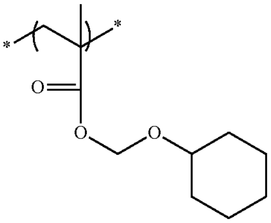

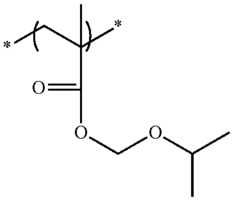

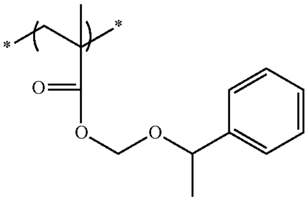

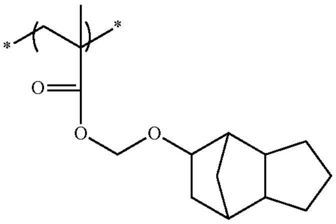

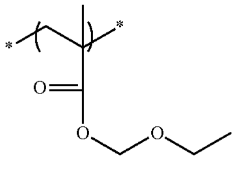

-continued

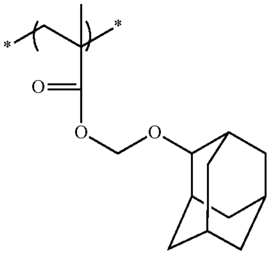

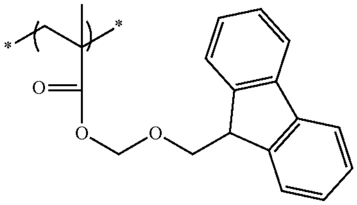

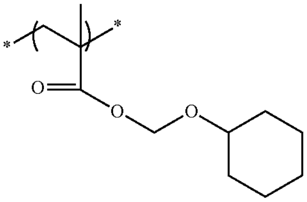

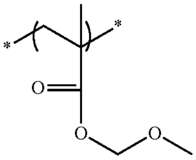

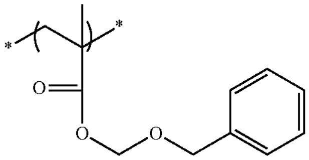

The resin P may contain a repeating unit represented by Formula (BZ).

(BZ)

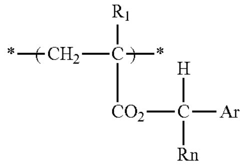

In Formula (BZ), AR represents an aryl group. Rn represents an alkyl group, a cycloalkyl group, or an awl group. Rn and AR may be bonded to each other to form a non-aromatic ring.

$R_1$ represents a hydrogen atom, an alkyl group, a cycloalkyl group, a halogen atom, a cyano group, or an alkyloxycarbonyl group.

Specific examples of the repeating unit represented by Formula (BZ) will be shown below; however, the present invention is not limited thereto.

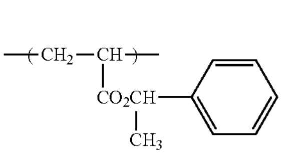

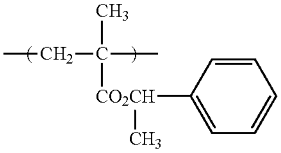

-continued

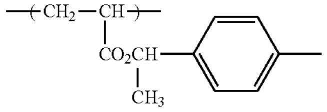

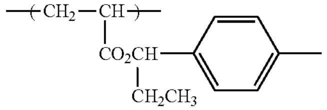

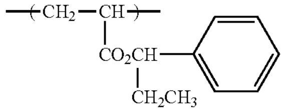

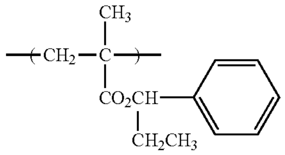

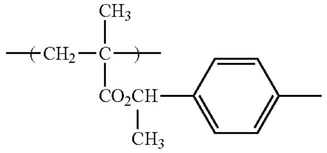

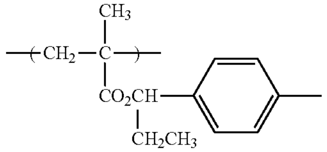

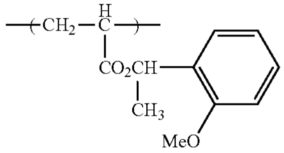

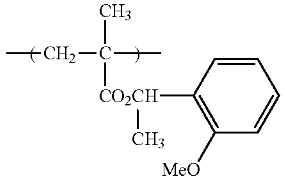

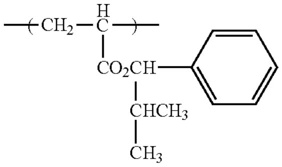

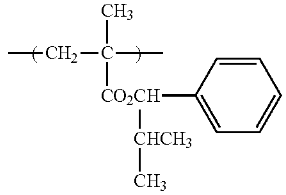

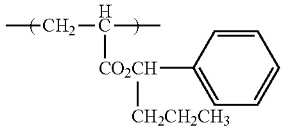

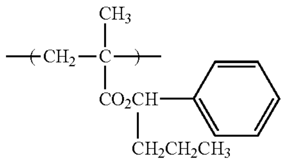

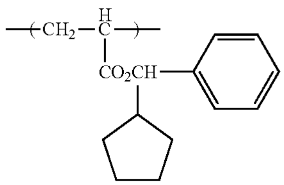

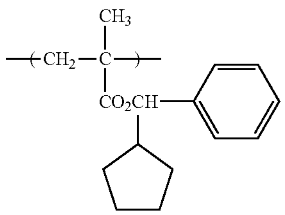

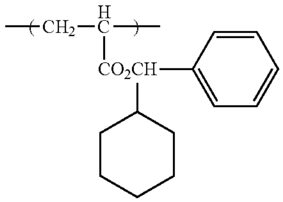

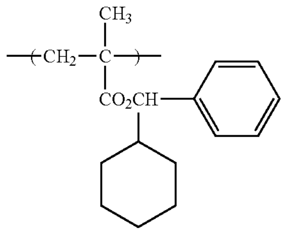

-continued

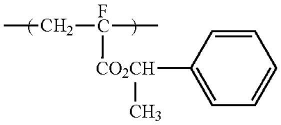

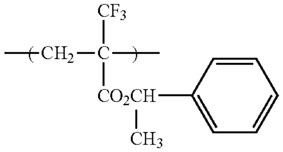

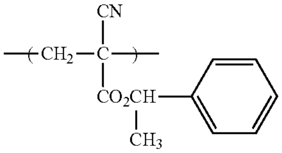

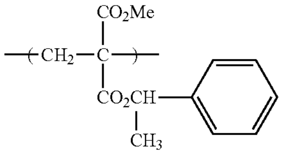

In the resin P, the content of the repeating unit having an acid-decomposable group (the total content in a case where the resin P contains a plurality of kinds of repeating units) is preferably 5% to 80% by mole, more preferably 5% to 75% by mole, and still more preferably 10% to 65% by mole, with respect to all the repeating units in the resin P.

The resin P may contain a repeating unit represented by Formula (V) or Formula (VI).

(V)

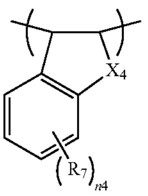

(VI)

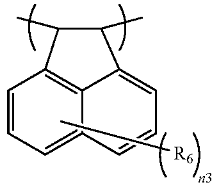

In the formulae, $R_6$ and $R_7$ each independently represent a hydrogen atom, a hydroxy group, a linear, branched, or cyclic alkyl group having 1 to 10 carbon atoms, an alkoxy group, an acyloxy group, a cyano group, a nitro group, an amino group, a halogen atom, an ester group (—OCOR or —COOR: R represents an alkyl group having 1 to 6 carbon atoms or a fluorinated alkyl group), or a carboxyl group.

$n_3$ represents an integer of 0 to 6.

$n_4$ represents an integer of 0 to 4.

$X^4$ represents a methylene group, an oxygen atom, or a sulfur atom.

Specific examples of the repeating unit represented by Formula (V) or Formula (VI) will be shown below, but they are not limited thereto.

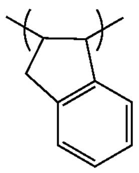

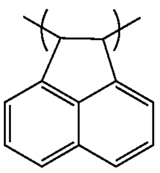

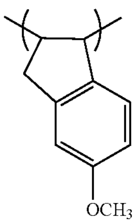

-continued

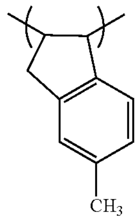

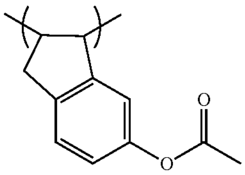

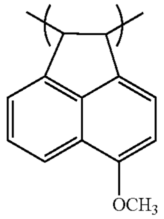

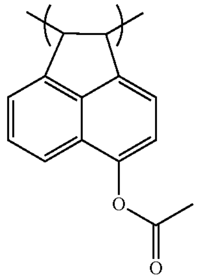

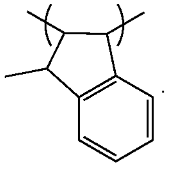

The resin P may further contain a repeating unit having a silicon atom on a side chain. Examples of the repeating unit having a silicon atom on a side chain include a (meth)acrylate-based repeating unit having a silicon atom, a vinyl-based repeating unit having a silicon atom. The repeating unit having a silicon atom on a side chain is typically a repeating unit having a group having a silicon atom on a side chain. Examples of the group having a silicon atom include a trimethylsilyl group, a triethylsilyl group, a triphenylsilyl group, a tricyclohexylsilyl group, a tristrimethylsiloxysilyl group, a tristrimethylsilyl silyl group, a methyl bistrimethylsilyl silyl group, a methyl bistrimethylsiloxysilyl group, a dimethyltrimethylsilyl silyl group, a dimethyl trimethylsiloxysilyl group, and a cyclic or linear polysiloxane shown below, or a cage-type, ladder-type, or random-type silsesquioxane structure. In the formulae, R and $R^1$ each independently represent a monovalent substituent. * represents a bonding site.

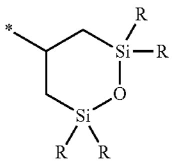

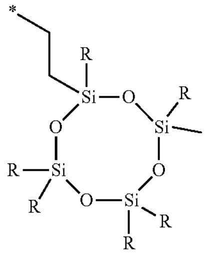

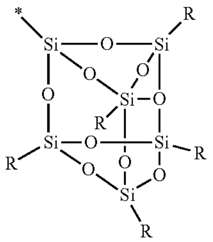

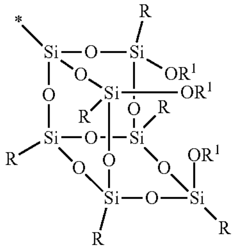

-continued

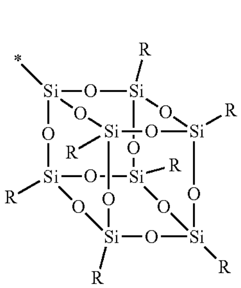

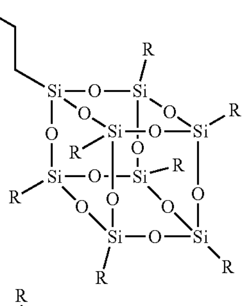

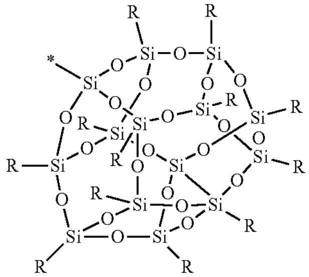

The repeating unit having the above-described group is preferably, for example, a repeating unit derived from an acrylate or methacrylate compound having the above-described group, or a repeating unit derived from a compound having the above-described group and a vinyl group.

It is preferable that the repeating unit having a silicon atom is a repeating unit having a silsesquioxane structure. In a case where the repeating unit has a silsesquioxane structure, an extremely excellent collapse suppression performance can be exhibited in the formation of a pattern (for example, a line width of 50 nm or less) which is ultrafine and of which the cross-sectional shape has a high aspect ratio (for example, a ratio of film thickness/line width of 3 or more).

Examples of the silsesquioxane structure include a cage-type silsesquioxane structure, a ladder-type silsesquioxane structure, and a random-type silsesquioxane structure. Among them, a cage-type silsesquioxane structure is preferable.

Here, the cage-type silsesquioxane structure is a silsesquioxane structure having a cage-shaped skeleton. The cage-type silsesquioxane structure may be a complete cage-type silsesquioxane structure or an incomplete cage-type silsesquioxane structure; however, it is preferably a complete cage-type silsesquioxane structure.

The ladder-type silsesquioxane structure is a silsesquioxane structure having a ladder-shaped skeleton.

The random-type silsesquioxane structure is a silsesquioxane structure having a random skeleton.

The cage-type silsesquioxane structure is preferably a siloxane structure represented by Formula (S).

(S)

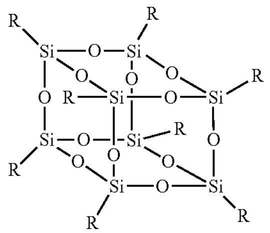

In Formula (S), R represents a monovalent organic group. A plurality of R's may be the same or different from each other.

The organic group is not particularly limited; however, specific examples thereof include a hydroxy group, a nitro group, a carboxy group, an alkoxy group, an amino group, a mercapto group, a blocked mercapto group (for example, a mercapto group blocked (protected) by an acyl group), an acyl group, an imide group, a phosphino group, a phosphinyl group, a silyl group, a vinyl group, a hydrocarbon group which may have a heteroatom, a (meth)acryl group-containing group, and an epoxy group-containing group.

Examples of the heteroatom in the hydrocarbon group which may have a heteroatom include an oxygen atom, a nitrogen atom, a sulfur atom, and a phosphorus atom.

Examples of the hydrocarbon group as the hydrocarbon group which may have a heteroatom include an aliphatic hydrocarbon group, an aromatic hydrocarbon group, and a group obtained by combining these.

The aliphatic hydrocarbon group may be either linear, branched, or cyclic. Specific examples of the aliphatic hydrocarbon group include a linear or branched alkyl group (particularly having 1 to 30 carbon atoms), a linear or branched alkenyl group (particularly having 2 to 30 carbon atoms), or a linear or branched alkynyl group (particularly having 2 to 30 carbon atoms).

Examples of the aromatic hydrocarbon group include an aromatic hydrocarbon group having 6 to 18 carbon atoms such as a phenyl group, a tolyl group, a xylyl group, or a naphthyl group.

In a case where the resin P has the repeating unit having a silicon atom on a side chain, the content thereof is preferably 1% to 30% by mole, more preferably 5% to 25% by mole, and still more preferably 5% to 20% by mole, with respect to all the repeating units in the resin P.

As a polystyrene equivalent value that is measured by a gel permeation chromatography (GPC) method, the weight-average molecular weight of the resin P is preferably 1,000 to 200,000, more preferably 3,000 to 20,000, and still more preferably 5,000 to 15,000. In a case where the weight-average molecular weight is 1,000 to 200,000, it is possible to prevent the deterioration of heat resistance and dry etching resistance, and it is possible to prevent the deterioration of developability or to prevent the deterioration of film forming properties due to the increase in viscosity.

The dispersity (the molecular weight distribution) is generally 1 to 5, and it is preferably 1 to 3, more preferably 1.2 to 3.0, and still more preferably 1.2 to 2.0.

In the total solid content of the resist composition, the content of the resin P is preferably 50% to 99.9% by mass and more preferably 60% to 99.0% by mass.

In addition, in the resist composition, one kind of resin P may be used singly, or two or more kinds thereof may be used in combination.

(Photoacid Generator)

The resist composition preferably contains a photoacid generator. The photoacid generator is not particularly limited, and a known photoacid generator can be used.

The content of the photoacid generator in the resist composition is not particularly limited; however, in general, it is preferably 0.1% to 20% by mass and more preferably 0.5% to 20% by mass with respect to the total solid content of the resist composition. One kind of photoacid generator may be used singly, or two or more kinds thereof may be used in combination. In a case where two or more kinds of photoacid generators are used in combination, the total content thereof is preferably within the above range.

Examples of the photoacid generator include the compounds disclosed in JP2016-57614A, JP2014-219664A, JP2016-138219A, and JP2015-135379A.

(Quencher)

The resist composition may contain a quencher (an acid diffusion control agent). The quencher is not particularly limited, and a known quencher can be used.

The quencher is, for example, a basic compound, and it has a function of suppressing the acid-decomposable resin from being unintendedly decomposed in unexposed regions due to the acid diffused from exposed regions.

The content of the quencher in the resist composition is not particularly limited; however, in general, it is preferably 0.1% to 15% by mass and more preferably 0.5% to 8% by mass with respect to the total solid content of the resist composition. One kind of quencher may be used singly, or two or more kinds thereof may be used in combination. In a case where two or more kinds of quenchers are used in combination, the total content thereof is preferably within the above range.

Examples of the quencher include the compounds disclosed in JP2016-57614A, JP2014-219664A, JP2016-138219A, and JP2015-135379A.

(Hydrophobic Resin)

The resist composition may contain a hydrophobic resin.

It is preferable that the hydrophobic resin is designed to be unevenly distributed on the surface of the resist film. However, unlike the surfactant, it does not necessarily need to have a hydrophilic group in the molecule and may not contribute to the uniform mixing of a polar material and a non-polar material.

Examples of the effect of the addition of the hydrophobic resin include the control of static and dynamic contact angles of the surface of the resist film with respect to water and the suppression of outgassing.

The hydrophobic resin preferably has any one or more of a "fluorine atom", a "silicon atom", and a "$CH_3$ partial structure which is contained in a side chain moiety of a resin", and more preferably has two or more thereof, from the viewpoint of uneven distribution on the film surface layer. In addition, the hydrophobic resin preferably has a hydrocarbon group having 5 or more carbon atoms. This group may be contained in the main chain of the resin or may be substituted in the side chain thereof.

In a case where hydrophobic resin includes a fluorine atom and/or a silicon atom, the fluorine atom and/or the silicon atom in the hydrophobic resin may be contained in the main chain of the resin or the side chain thereof.

In a case where the hydrophobic resin includes a fluorine atom, the partial structure having a fluorine atom is preferably an alkyl group having a fluorine atom, a cycloalkyl group having a fluorine atom, or an awl group having a fluorine atom.

The alkyl group having a fluorine atom (preferably having 1 to 10 carbon atoms and more preferably having 1 to 4 carbon atoms) is a linear or branched alkyl group in which at least one hydrogen atom is substituted with a fluorine atom, and it may further have a substituent other than the fluorine atom.

The cycloalkyl group having a fluorine atom is a monocyclic or polycyclic cycloalkyl group in which at least one hydrogen atom is substituted with a fluorine atom, and it may further have a substituent other than the fluorine atom.

Examples of the aryl group having a fluorine atom include an aryl group such as a phenyl group or a naphthyl group, in which at least one hydrogen atom is substituted with a fluorine atom, and the aryl group may further have a substituent other than the fluorine atom.

Examples of the repeating unit having a fluorine atom or a silicon atom include those exemplified in paragraph [0519] of US2012/0251948A1.

In addition, as described above, it is also preferable that the hydrophobic resin includes a $CH_3$ partial structure in the side chain moiety.

Here, the $CH_3$ partial structure contained in the side chain moiety in the hydrophobic resin includes a $CH_3$ partial structure contained in an ethyl group, a propyl group.

On the other hand, a methyl group bonded directly to the main chain of the hydrophobic resin (for example, an α-methyl group in the repeating unit having a methacrylic acid structure) makes only a small contribution to the uneven distribution of the hydrophobic resin on the surface due to the effect of the main chain, and thus it is not included in the $CH_3$ partial structure in the present invention.

With regard to the hydrophobic resin, reference can be made to the description in paragraphs [0348] to [0415] of JP2014-010245A, the contents of which are incorporated in the present specification by reference.

It is noted that, for the hydrophobic resin, the resins described in JP2011-248019A, JP2010-175859A, and JP2012-032544A can also be preferably used, in addition to those described above.

Examples of the hydrophobic resin include resins represented by Formula (1b) to Formula (5b).

(1b)

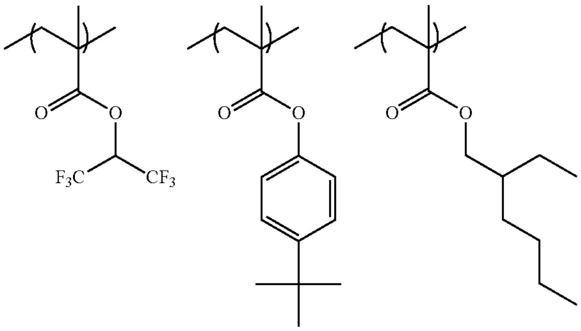

(2b)

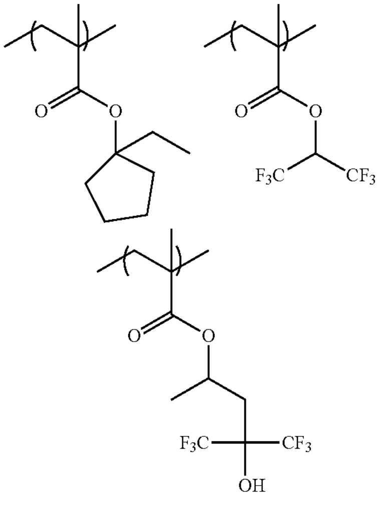

-continued (3b)

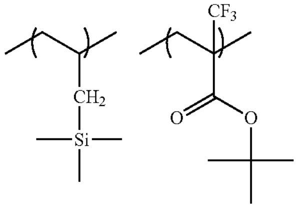

(4b)

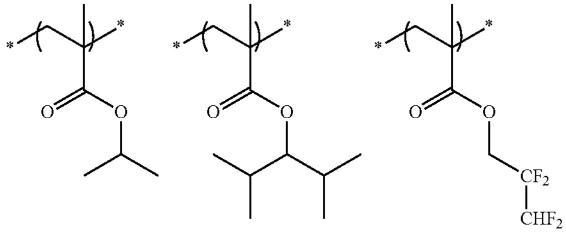

(5b)

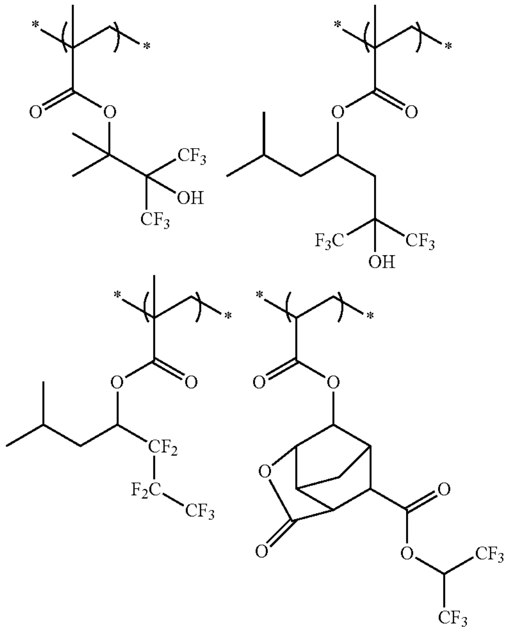

In a case where the resist composition contains a hydrophobic resin, the content of the hydrophobic resin is preferably 0.01% to 20% by mass and more preferably 0.1% to 15% by mass with respect to the total solid content of the composition.

(Solvent)

The resist composition may contain a solvent. The solvent is not particularly limited, and a known solvent can be used.

The solvent contained in the resist composition may be the same or different from the organic solvent contained in the mixture in the pre-wet liquid described above.

The content of the solvent in the resist composition is not particularly limited; however, in general, the solvent is preferably contained so that the total solid content of the resist composition is adjusted to 0.1% to 20% by mass, and the solvent is more preferably contained so that the total solid content of the resist composition is adjusted to 0.5% to 10% by mass. One kind of solvent may be used singly, or two or more kinds thereof may be used in combination. In a case where two or more kinds of solvents are used in combination, the total content thereof is preferably within the above range.

Examples of the solvent include the solvents disclosed in JP2016-057614A, JP2014-219664A, JP2016-138219A, and JP2015-135379A.

(Other Additives)

In addition, as necessary, the resist composition may further contain a surfactant, an acid proliferation agent, a dye, a plasticizer, a photosensitizing agent, a light absorbing agent, an alkali-soluble resin other than the above resins, and/or a dissolution inhibitor.

In order to form a resist film (a resist composition film) on a substrate using a resist composition, a resist composition is prepared by dissolving each of the components as described above in a solvent, filtered using a filter as necessary, and then applied onto a substrate (a pre-wetted substrate). The pore size of the filter is preferably 0.1 μm or less, more preferably 0.05 μm or less, and still more preferably 0.03 μm or less. In addition, the filter is preferably made of polytetrafluoroethylene, made of polyethylene, or made of nylon.

The resist composition is applied onto the substrate by a proper application method such as spin coating. Then, the applied resist composition is dried to form a resist film.

Examples of the drying method include a method of heating to carry out drying. The heating can be carried out with a unit including a general exposure and development machine or may be carried out using a hot plate or the like.

The heating temperature is preferably 80° C. to 180° C., more preferably 80° C. to 150° C., still more preferably 80° C. to 140° C., and particularly preferably 80° C. to 130° C. The heating time is preferably 30 to 1,000 seconds, more preferably 60 to 800 seconds, and still more preferably 60 to 600 seconds.

The film thickness of the resist film is generally 1 to 200 nm and preferably 10 to 100 nm.

In the resist film forming method and/or the pattern forming method according to the embodiment of the present invention, an upper layer film (a topcoat film) may be formed on the upper layer of the resist film. The upper layer film can be formed by using, for example, a composition for forming an upper layer film, containing a hydrophobic resin, a photoacid generator, and a basic compound.

[(C) Exposure Step]

The exposure step is a step of exposing the resist film. The method of exposing the resist film is not particularly limited, and a known method can be used.

Examples of the method of exposing the resist film include a method of irradiating the resist film with actinic rays or radiation through a predetermined mask. In a case of a method of irradiating a resist film with electron beams, the resist film may be irradiated without interposing a mask (this is also referred to as "direct drawing")

The actinic rays or the radiation that is used for exposure is not particularly limited, and examples thereof include a KrF excimer laser, an ArF excimer laser, an extreme ultraviolet (EUV) ray, and an electron beam (EB). An extreme ultraviolet ray or an electron beam is preferable. The exposure may be liquid immersion exposure.

<Post Exposure Bake (PEB) Step>

It is preferable that the above-described pattern forming method further includes a post exposure bake (PEB) step of baking the resist film after exposure, before the exposure step and the development step. The baking accelerates the reaction in exposed portions, and the sensitivity and/or the pattern shape is further improved.

The heating temperature is preferably 80° C. to 150° C., more preferably 80° C. to 140° C., and still more preferably 80° C. to 130° C.

The heating time is preferably 30 to 1,000 seconds, more preferably 60 to 800 seconds, and still more preferably 60 to 600 seconds.

The heating can be carried out by a unit including a general exposure and development machine or may be carried out using a hot plate or the like.

[(D) Development Step]

The development step is a step of developing the exposed resist film (hereinafter, also referred to as the "resist film obtained after exposure") by using a developing liquid.

The developing method is not particularly limited, and a known developing method can be used. Examples of the developing method include a dipping method, a puddle method, a spray method, and a dynamic dispensing method.

In addition, the above pattern forming method may further include a step of substituting the developing liquid with another solvent and then stopping the development after the development step.

The developing time is not particularly limited; however, in general, it is preferably 10 to 300 seconds and more preferably 10 to 120 seconds. The temperature of the developing liquid is preferably 0° C. to 50° C. and more preferably 15° C. to 35° C. In the pattern forming method, it suffices that at least one time of the development step is included, and a plurality of times of the development step may be included.

<Developing Liquid>

The developing liquid is not particularly limited, and a known developing liquid can be used. Examples of the developing liquid include an alkaline developing liquid and a developing liquid containing an organic solvent (an organic developing liquid).

In the development step, both the development using the developing liquid containing an organic solvent and the development using an alkaline developing liquid may be carried out (so-called a double development may be carried out).

<Rinsing Step>

It is preferable that the pattern forming method further includes a rinsing step after the development step.

The rinsing step is a step of washing the wafer, which comprises the resist film obtained after development, by using a rinsing liquid.

The washing method is not particularly limited, and a known washing method can be used. Examples of the washing method include a rotatory ejection method, a dipping method, and a spray method.

Among these, it is preferable that a rotatory ejection method is used for washing a wafer and then the washed wafer is rotated at a rotation speed of 2,000 to 4,000 rpm to remove the rinsing liquid from the substrate.

In general, the rinsing time is preferably 10 to 300 seconds, more preferably 10 to 180 seconds, and still more preferably 20 to 120 seconds. The temperature of the rinsing liquid is preferably 0° C. to 50° C. and more preferably 15° C. to 35° C.

(Rinsing Liquid)

In a case of rinsing a wafer having a resist film after the development using an alkaline developing liquid, the rinsing liquid is preferably pure water, and it may be pure water containing a surfactant.

In a case of rinsing a wafer having a resist film after the development using an organic developing liquid, the rinsing liquid is preferably a rinsing liquid containing an organic solvent. The organic solvent contained in the rinsing liquid is preferably, for example, at least one organic solvent selected from the group consisting of a hydrocarbon-based solvent, a ketone-based solvent, an ester-based solvent, an alcohol-based solvent, an amide-based solvent, and an ether-based solvent, more preferably at least one selected from the group consisting of a hydrocarbon-based solvent, an ether-based solvent, and a ketone-based solvent, and still more preferably at least one selected from the group consisting of a hydrocarbon-based solvent and an ether-based solvent.

In a case where a developing liquid containing an organic solvent is used in the development step, the pattern forming method may include a rinsing step after the development step; however, the rinsing step may not be included from the viewpoint of throughput (productivity).

As the pattern forming method that does not include a rinsing step, for example, the description in paragraphs 0014 to 0086 of JP2015-216403A can be referenced, and the content thereof is incorporated in the present specification.

The rinsing liquid is also preferably methyl isobutyl carbinol (MIBC) or the same liquid (particularly butyl acetate) as the developing liquid.

<Other Steps>

The above-described pattern forming method may include other steps in addition to the steps described above. Examples of the other steps include a washing step using a supercritical fluid and a heating step.

<Removing Step Using Supercritical Fluid>

The removing step using a supercritical fluid is a step of removing the developing liquid adhered onto the pattern and/or the rinsing liquid with a supercritical fluid after the development treatment and/or the rinse treatment.

(Heating Step)

The heating step is a step of heating the resist film to remove the solvent remaining in the pattern after the development step, the rinsing step, or the removing step using a supercritical fluid.

The heating temperature is not particularly limited; however, in general, it is preferably 40° C. to 160° C., more preferably 50° C. to 150° C., and still more preferably 50° C. to 110° C.

The heating time is not particularly limited; however, in general, it is preferably 15 to 300 seconds and more preferably 15 to 180 seconds.

(BARC Composition Coating Step)

The pattern forming method may include a step of applying a bottom of anti-reflection coating (BARC) composition onto a wafer before (B) the resist film forming step. In addition, the BARC composition coating step may further include a step of removing a BARC composition unintendedly applied onto the edge part (the end part) of the wafer.

[Kit]

The kit according to the embodiment of the present invention is a kit including the above-described pre-wet liquid and a resist composition.

The kit according to the embodiment of the present invention is a kit including the pre-wet liquid already described and a resist composition. The form of the kit is not particularly limited; however, examples thereof include a form that includes a chemical liquid storage body having a first container and a pre-wet liquid accommodated in the first container and includes a resist composition storage body having a second container and a resist composition accommodated in the second container. Each of the pre-wet liquid and the resist composition is as described above. In addition, as the first container and the second container, the containers already described (the container of the chemical liquid storage body or the like) can be used.

The above kit can be used in the use application in which a resist film is formed on a substrate after undergoing pre-wetting with the pre-wet liquid, by the method already described using the resist composition of the above kit. According to the above kit, the resist-saving properties are excellent, and thus the occurrence of defects is further suppressed.

EXAMPLES

Hereinafter, the present invention will be described in more detail with reference to Examples. The materials, the using amounts of materials, the proportions, the treatment details, the treatment procedure, and the like shown in Examples below may be appropriately modified as long as the modifications do not depart from the spirit of the present invention. Accordingly, the scope of the present invention should not be construed as being limited to Examples shown below.

[Pre-Wet Liquid]

<Preparation of Organic Solvent>

The kinds of organic solvents used for producing the pre-wet liquids of Examples and Comparative Examples and physical properties thereof are shown in Table 1 below.

In the table, "PGME" means propylene glycol monomethyl ether, "PGMEA" means propylene glycol monomethyl ether acetate, "PC" means propylene carbonate, and "CyHx" means cyclohexanone.

The column of "Classification" indicates the classification of each organic solvent. The description of "A1" means that the organic solvent is the organic solvent A and corresponds to an organic solvent that can be used as a single solvent. The description of "A2" means that the organic solvent is the organic solvent A and corresponds to an organic solvent that cannot be used as a single solvent. The description of "B" means that the organic solvent corresponds to the organic solvent B.

Each of the organic solvents of a high-purity grade having a purity of more than 99% by mass was used.

TABLE 1

| | Classification | Molecular weight (g/mol) | Vapor pressure (mmHg) | Surface tension (mN/m) | Viscosity (cP) | SP value ($MPa^{1/2}$) | Boiling point (° C.) |
|---|---|---|---|---|---|---|---|
| Ethyl pyruvate | A1 | 116.1 | 3.6 | 33.8 | 1.2 | 20.5 | 144 |
| Methyl 3-methoxypropionate | A2 | 118.1 | 2.4 | 30.5 | 1.1 | 19.0 | 144 |
| Dimethyl malonate | A2 | 132.1 | 1.1 | 37.2 | 1.8 | 20.5 | 184 |
| Ethyl 2-methylacetoacetate | A2 | 172.2 | 1.5 | 34.9 | 1.7 | 19.1 | 170 |
| Methyl 3-methoxypropionate | A2 | 118.1 | 2.4 | 30.5 | 1.1 | 19.0 | 144 |
| Methyl pyruvate | A2 | 102.9 | 5.2 | 34.3 | 1.2 | 21.6 | 138 |
| Methyl methoxyacetate | A2 | 104.1 | 6.0 | 32.5 | 1.4 | 19.5 | 132 |
| Methyl pyruvate | A2 | 102.9 | 5.2 | 34.3 | 1.2 | 21.6 | 138 |

TABLE 1-continued

| | Classification | Molecular weight (g/mol) | Vapor pressure (mmHg) | Surface tension (mN/m) | Viscosity (cP) | SP value ($MPa^{1/2}$) | Boiling point (° C.) |
|---|---|---|---|---|---|---|---|
| 2-methoxy-1,3 dioxolane | A2 | 104.1 | 7.5 | 34.6 | 1.3 | 20.1 | 130 |
| CyHx | A2 | 98.1 | 3.8 | 34.1 | 2.2 | 20.3 | 156 |
| PGMEA | B | 132.2 | 3.7 | 27.9 | 1.1 | 19.3 | 145 |
| PGME | B | 42.0 | 10.9 | 27.6 | 1.8 | 21.9 | 120 |
| nBA | B | 116.2 | 9.0 | 24.8 | 0.9 | 17.4 | 126 |
| PC | — | 102.1 | 0.4 | 41.9 | 3.8 | 27.2 | 240 |
| GBL | — | 86.1 | 1.1 | 41.9 | 1.9 | 25.6 | 204 |
| Anisole | — | 108.1 | 3.2 | 35.4 | 1.4 | 19.6 | 154 |

<Preparation of Pre-Wet Liquid>

Each kind of organic solvent shown in Table 1 was mixed at the mass ratio shown in the latter part of the table to obtain a mixture, which was used as a pre-wet liquid.

In Example 1, ethyl pyruvate itself was used as a pre-wet liquid.

[Test]

<Test of Resist-Saving Properties>

The resist-saving properties of the pre-wet liquid were evaluated according to the following method. A spin coater (product name "LITHIUS", manufactured by Tokyo Electron Limited) was used in the following test.

Each pre-wet liquid (2.0 cc) was added dropwise on a silicon wafer of a diameter of about 30 cm (12 inches), having an antireflection film, and continuously, a resist composition (a resist composition described later) was applied thereon while changing the coating amount.

Then, the minimum coating amount (the lower limit coating amount) of the resist composition, at which the presence of dryout (the coating unevenness of the resist film) was not confirmed in the coating film (the resist film) of the applied resist composition, was determined by visually observing the silicon wafer and compared with the following criteria.

It can be determined that the smaller the lower limit coating amount is, the better the resist-saving properties of each pre-wet liquid are.

A: The lower limit coating amount is 0.12 cc or less.

B: The lower limit coating amount is more than 0.12 cc and 0.17 cc or less.

C: The lower limit coating amount is more than 0.17 cc and 0.22 cc or less.

D: The lower limit coating amount is more than 0.22 cc and 0.40 cc or less.

E: The lower limit coating amount is more than 0.40 cc.

<Resist Composition>

The composition of the resist composition used in the above <Test of resist-saving properties> is shown below. The resist composition shown below is a resist composition for ArF exposure.

Acid-decomposable resin shown below (a resin represented by the formula below (weight-average molecular weight (Mw): 7,500): the numerical value described for each repeating unit means a value in terms of % by mole): 100 parts by mass

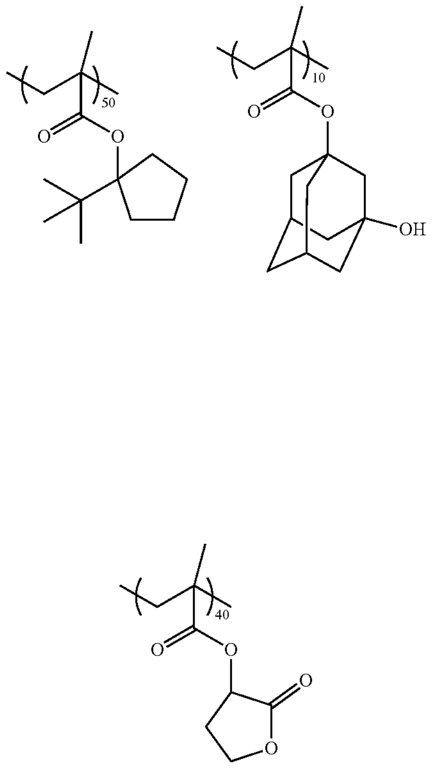

Photoacid generator shown below: 8 parts by mass

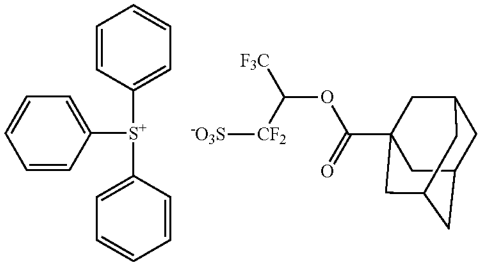

Quenchers shown below: 5 parts by mass (the mass ratio is 0.1:0.3:0.3:0.2 in order from the left). Among the following quenchers, the polymer-type quencher has a weight-average molecular weight (Mw) of 5,000. In addition, the numerical value described for each repeating unit means a value in terms of the molar ratio.

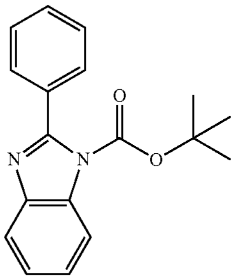

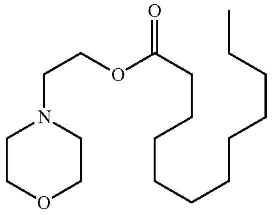

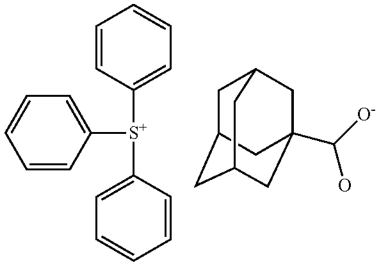

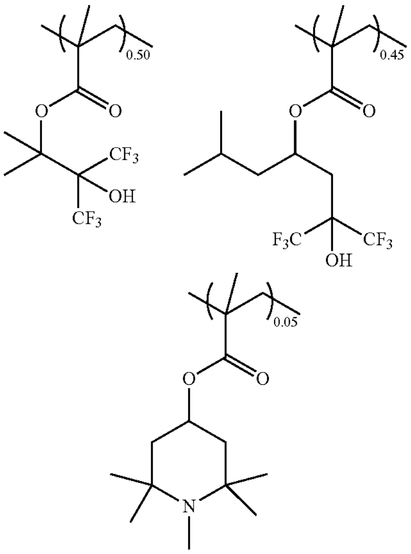

Hydrophobic resin shown below: 4 parts by mass (the mass ratio is 0.5:0.5 in order from the left). Among the following hydrophobic resins, the hydrophobic resin on the left has a weight-average molecular weight (Mw) of 7,000, and the hydrophobic resin on the right has a weight-average molecular weight (Mw) of 8,000. In each hydrophobic resin, the numerical value described for each repeating unit means a value in terms of the molar ratio.

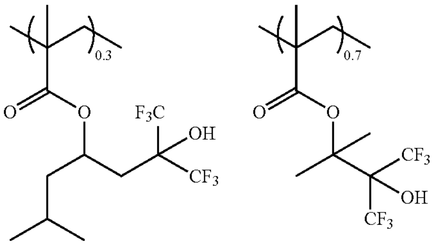

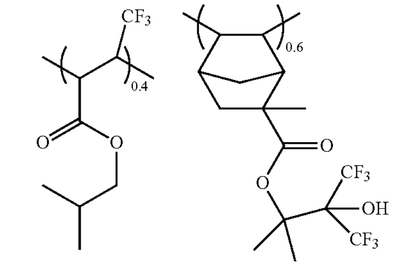

Solvents shown below:

Propylene glycol monomethyl ether acetate (PGMEA): 562 parts by mass

Cyclohexanone: 141 parts by mass

[Result]

The results are shown in the following table.

In the table, the column of “Organic solvent 1” and the column of “Organic solvent 2” indicate the kind, the classification, and the content (% by mass) of each organic solvent used for preparing the pre-wet liquid with respect to the total mass of the pre-wet liquid.

The column of “Pre-wet liquid” indicates the physical properties of the pre-wet liquid as a whole.

The column of “Maximum SP value” in the column of “Pre-wet liquid” indicates the SP value ($MPa^{1/2}$) of the organic solvent having the maximum SP value among the organic solvents used for preparing the pre-wet liquid.

TABLE 2

| | Organic solvent 1 | | | Organic solvent 2 | | | Pre-wet liquid | | | | | |
|---|---|---|---|---|---|---|---|---|---|---|---|
| | Kind | Classification | Content (% by mass) | Kind | Classification | Content (% by mass) | Vapor pressure (mmHg) | Viscosity (cp) | Maximum SP value ($MPa^{1/2}$) | Surface tension (mN/m) | Test result |
| Example 1 | Ethyl pyruvate | A1 | 100 | Methyl 3-methoxypropionate | | | 3.6 | 1.2 | 20.5 | 33.8 | A |
| Example 2 | Ethyl pyruvate | A1 | 75 | Methyl 3-methoxypropionate | A2 | 25 | 3.3 | 1.2 | 20.5 | 33.0 | A |
| Example 3 | Ethyl pyruvate | A1 | 50 | Methyl 3-methoxypropionate | A2 | 50 | 3.0 | 1.1 | 20.5 | 32.2 | B |
| Example 4 | Ethyl pyruvate | A1 | 25 | Methyl pyruvate | A2 | 75 | 2.7 | 1.1 | 20.5 | 31.3 | C |
| Example 5 | Ethyl pyruvate | A1 | 75 | Methyl pyruvate | A2 | 25 | 4.0 | 1.2 | 21.6 | 33.9 | A |
| Example 6 | Ethyl pyruvate | A1 | 50 | Methyl pyruvate | A2 | 50 | 4.4 | 1.2 | 21.6 | 34.1 | B |
| Example 7 | Ethyl pyruvate | A1 | 25 | Methyl pyruvate | A2 | 75 | 4.8 | 1.2 | 21.6 | 34.2 | C |
| Example 8 | Methyl 3-methoxy-propionate | A2 | 75 | Methyl pyruvate | A2 | 25 | 3.1 | 1.1 | 21.6 | 31.5 | A |

TABLE 2-continued

| | Organic solvent 1 | | | Organic solvent 2 | | | Pre-wet liquid | | | | | |
|---|---|---|---|---|---|---|---|---|---|---|---|
| | Kind | Classification | Content (% by mass) | Kind | Classification | Content (% by mass) | Vapor pressure (mmHg) | Viscosity (cp) | Maximum SP value ($MPa^{1/2}$) | Surface tension (mN/m) | Test result |
| Example 9 | Methyl 3-methoxy-propionate | A2 | 50 | Methyl pyruvate | A2 | 50 | 3.8 | 1.1 | 21.6 | 32.4 | A |
| Example 10 | Methyl 3-methoxy-propionate | A2 | 25 | Methyl pyruvate | A2 | 75 | 4.5 | 1.2 | 21.6 | 33.4 | B |
| Example 11 | Dimethyl malonate | A2 | 60 | Methyl pyruvate | A2 | 40 | 2.7 | 1.6 | 21.6 | 36.0 | C |
| Example 12 | Dimethyl malonate | A2 | 40 | Methyl pyruvate | A2 | 60 | 3.6 | 1.4 | 21.6 | 35.5 | A |
| Example 13 | Dimethyl malonate | A2 | 25 | Methyl pyruvate | A2 | 75 | 4.2 | 1.4 | 21.6 | 35.0 | A |
| Example 14 | Dimethyl malonate | A2 | 50 | Methyl methoxyacetate | A2 | 50 | 3.6 | 1.6 | 20.5 | 34.9 | B |
| Example 15 | Dimethyl malonate | A2 | 25 | Methyl methoxyacetate | A2 | 75 | 4.8 | 1.5 | 20.5 | 33.7 | C |
| Example 16 | Ethyl 2-methyl-acetoacetate | A2 | 40 | Methyl pyruvate | A2 | 60 | 3.7 | 1.4 | 21.6 | 34.5 | A |
| Example 17 | Ethyl 2-methyl-acetoacetate | A2 | 50 | Methyl pyruvate | A2 | 50 | 3.4 | 1.5 | 21.6 | 34.6 | B |
| Example 18 | Ethyl pyruvate | A1 | 80 | PGMEA | B | 20 | 3.6 | 1.2 | 20.5 | 32.6 | A |
| Example 19 | Ethyl pyruvate | A1 | 50 | PGMEA | B | 50 | 3.7 | 1.2 | 20.5 | 30.9 | A |
| Example 20 | Ethyl pyruvate | A1 | 80 | nBA | B | 20 | 4.7 | 1.1 | 20.5 | 32.0 | C |
| Example 21 | Methyl 3-methoxy-propionate | A2 | 80 | PGMEA | B | 20 | 2.7 | 1.1 | 19.3 | 30.0 | C |
| Example 22 | Methyl 3-methoxy-propionate | A2 | 95 | nBA | B | 5 | 2.7 | 1.1 | 19.0 | 30.2 | C |
| Example 23 | Dimethyl malonate | A2 | 70 | nBA | B | 30 | 3.5 | 1.5 | 20.5 | 33.5 | B |
| Example 24 | Ethyl 2-methyl-acetoacetate | A2 | 70 | nBA | B | 30 | 3.8 | 1.5 | 19.1 | 31.9 | B |
| Comparative Example 1 | PGMEA | B | 30 | PGME | B | 70 | 8.7 | 1.6 | 21.9 | 27.7 | E |
| Comparative Example 2 | PGMEA | B | 70 | nBA | B | 30 | 5.3 | 1.0 | 19.3 | 27.0 | E |
| Comparative Example 3 | PGME | B | 70 | nBA | B | 30 | 10.3 | 1.5 | 21.9 | 26.8 | E |
| Comparative Example 4 | PC | | 30 | PGMEA | B | 70 | 2.7 | 1.9 | 27.2 | 32.1 | D |
| Comparative Example 5 | GBL | | 20 | PGMEA | B | 80 | 3.2 | 1.3 | 25.6 | 30.7 | D |
| Comparative Example 6 | GBL | | 100 | | | | 1.1 | 1.9 | 25.6 | 41.9 | E |
| Comparative Example 7 | Ethyl pyruvate | A2 | 100 | | | | 5.2 | 1.2 | 21.6 | 34.3 | D |
| Comparative Example 8 | Anisole | | 100 | | | | 3.2 | 1.4 | 19.6 | 35.4 | D |
| Comparative Example 9 | 2-methoxy-1,3 dioxolane | A2 | 70 | PGMEA | B | 30 | 6.4 | 1.2 | 20.1 | 32.6 | D |
| Comparative Example 10 | CyHx | A2 | 100 | | | | 3.8 | 2.2 | 20.3 | 34.1 | D |

As shown in Table 1, the pre-wet liquid of each Example has good resist-saving performance.

Above all, it has been confirmed that the vapor pressure of the pre-wet liquid is preferably 2.8 to 4.7 mmHg (more preferably 3.2 to 4.2 mmHg) from the viewpoint that the effects of the present invention are more excellent.

It has been confirmed that the viscosity of the pre-wet liquid is preferably 1.4 cP or less from the viewpoint that the effects of the present invention are more excellent.

<Test Using Resist Composition for EUV Exposure>

The test using the pre-wet liquid of each Example and each Comparative Example was carried out in the same manner as described above except that in the above-described test of <Test of resist-saving properties>, the resist composition to be used was replaced with the resist composition for EUV exposure shown below instead of the above-described resist composition for ArF exposure. As a result of the test, even in a case where the resist composition for EUV exposure was used as the resist composition, the same results as in the case where the resist composition for ArF exposure was used were obtained.

(Resist Composition for EUV Exposure)

Resin (A-1): 0.77 g

Photoacid generator (B-1): 0.03 g

Basic compound (E-3): 0.03 g

PGMEA (a commercially available product, high-purity grade): 67.5 g

Ethyl lactate (a commercially available product, high-purity grade): 75 g

Resin

As a resin, the following resin was used.

Resin A-1

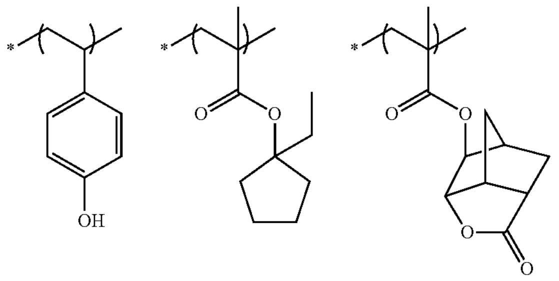

| Composition ratio (molar ratio) from the left | Mw | Mw/Mn |
|---|---|---|
| 30/60/10 | 11,200 | 1.45 |

Photoacid Generator

As a photoacid generator, the following compound was used.

(B-1)

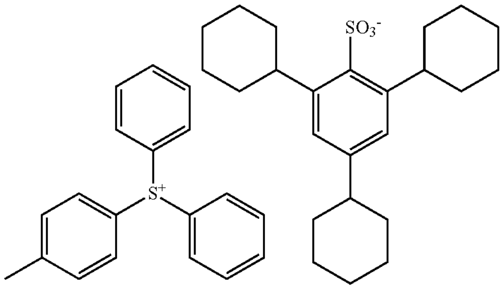

Basic Compound

As a basic compound, the following compound was used.

(E-3)

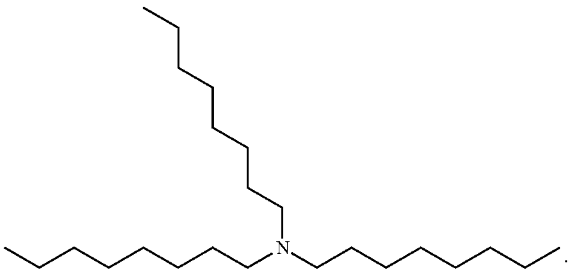

What is claimed is:

1. A pre-wet liquid having a surface tension of 29.0 mN/m or more, a viscosity of 1.4 cP or less, and a vapor pressure of 3.2 to 4.2 mmHg, wherein the pre-wet liquid consists of a single solvent which is one kind of organic solvent or a mixed solvent of two or more kinds of organic solvents, in a case where the pre-wet liquid consists of the single solvent, the organic solvent is ethyl pyruvate, and in a case where the pre-wet liquid consists of the mixed solvent, the mixed solvent satisfies the following requirement 1 or requirement 2, requirement 1: the mixed solvent is a mixed solvent consisting of only two or more kinds of organic solvents A, and the organic solvent A is an organic solvent selected from the group consisting of ethyl pyruvate, methyl pyruvate, methyl acetoacetate, methyl methoxyacetate, acetyl acetone, dimethyl malonate, methyl 3-methoxypropionate, diethyl oxalate, ethyl 2-methylacetoacetate, acetonyl acetone, 1,2-diacetoxypropane, cyclohexanone, and 2-methoxy-1,3 dioxolane, requirement 2: the mixed solvent is a mixed solvent of the organic solvent A and an organic solvent B, and the organic solvent B is an organic solvent selected from the group consisting of propylene glycol monomethyl ether acetate, propylene glycol monomethyl ether, butyl acetate, isoamyl acetate, amyl acetate, butyl propionate, isobutyl propionate, and pentyl acetate.

2. The pre-wet liquid according to claim 1, wherein the organic solvent A is an organic solvent selected from the group consisting of ethyl pyruvate, methyl pyruvate, methyl acetoacetate, methyl methoxyacetate, acetyl acetone, dimethyl malonate, methyl 3-methoxypropionate, diethyl oxalate, ethyl 2-methylacetoacetate, acetonyl acetone, and 1,2-diacetoxypropane.

3. The pre-wet liquid according to claim 1, wherein the pre-wet liquid is used by being applied onto a substrate onto which a resist composition for ArF exposure, a resist composition for EUV exposure, or a resist composition for KrF exposure is applied.

4. A resist film forming method comprising:

a pre-wetting step of applying the pre-wet liquid according to claim 1 onto a substrate; and a resist film forming step of applying a resist composition onto the substrate after the pre-wetting step.

5. A pattern forming method comprising:

a pre-wetting step of applying the pre-wet liquid according to claim 1 onto a substrate;

a resist film forming step of forming a resist film onto the substrate after the pre-wetting step, by using a resist composition;

an exposure step of exposing the resist film; and a development step of developing the exposed resist film by using a developing liquid, wherein the resist composition contains a resin consisting of at least one repeating unit selected from the group consisting of a repeating unit represented by Formula (a), a repeating unit represented by Formula (b), a repeating unit represented by Formula (c), and a repeating unit represented by Formula (d), and a repeating unit represented by Formula (e), (a)

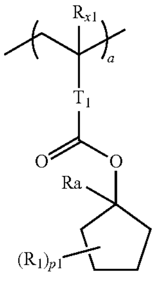

(b)

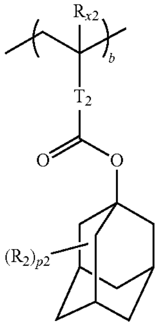

(c)

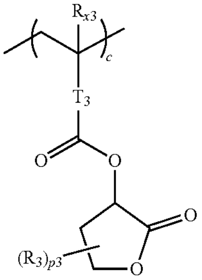

(d)

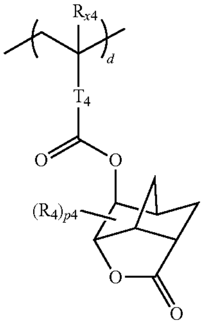

(e)

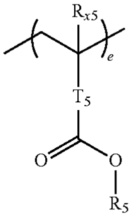

$R_{x1}$ to $R_{x5}$ each independently represent a hydrogen atom or an alkyl group which may have a substituent, $R_1$ to $R_4$ each independently represent a monovalent substituent, $p_1$ to $p_4$ each independently represent 0 or a positive integer, $R_a$ represents a linear or branched alkyl group, $T_1$ to $T_5$ each independently represent a single bond or a divalent linking group, $R_5$ represents a monovalent organic group, and a to e are represented in terms of % by mole and each independently represent numbers in ranges of $0 \le a \le 100$, $0 \le b \le 100$, $0 \le c < 100$, $0 \le d < 100$, and $0 \le e < 100$, respectively, provided that $a+b+c+d+e=100$ is satisfied, and $a+b \neq 0$ is satisfied, provided that the repeating unit represented by Formula (e) is different from any one of the repeating units represented by Formulae (a) to (d).

6. A kit comprising:

the pre-wet liquid according to claim 1; and a resist composition, wherein the resist composition contains a resin consisting of at least one repeating unit selected from the group consisting of a repeating unit represented by Formula (a), a repeating unit represented by Formula (b), a repeating unit represented by Formula (c), and a repeating unit represented by Formula (d), and a repeating unit represented by Formula (e), (a)

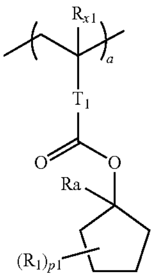

(b)

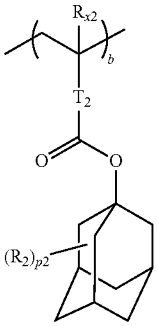

(c)

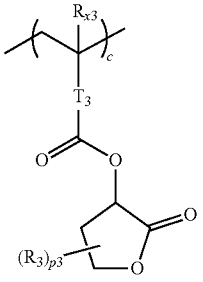

-continued (d)

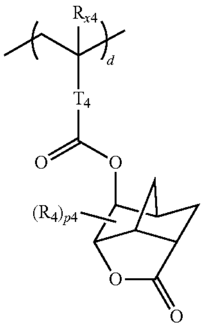

(e)

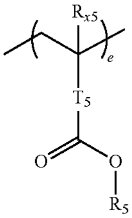

$R_{x1}$ to $R_{x5}$ each independently represent a hydrogen atom or an alkyl group which may have a substituent, $R_1$ to $R_4$ each independently represent a monovalent substituent, $p_1$ to $p_4$ each independently represent 0 or a positive integer, $R_a$ represents a linear or branched alkyl group, $T_1$ to $T_5$ each independently represent a single bond or a divalent linking group, $R_5$ represents a monovalent organic group, and a to e are represented in terms of % by mole and each independently represent numbers in ranges of $0 \le a \le 100$, $0 \le b \le 100$, $0 \le c < 100$, $0 \le d < 100$, and $0 \le e < 100$, respectively, provided that $a+b+c+d+e=100$ is satisfied, and $a+b \ne 0$ is satisfied, provided that the repeating unit represented by Formula (e) is different from any one of the repeating units represented by Formulae (a) to (d).

7. A kit comprising:

the pre-wet liquid according to claim 1; and a resist composition, wherein the resist composition contains a resin having a repeating unit which has a phenolic hydroxyl group and having a group which is decomposed under an action of an acid to generate a polar group.

8. A kit comprising:

the pre-wet liquid according to claim 1; and a resist composition, wherein the resist composition contains a hydrophobic resin and a resin having a group which is decomposed under an action of an acid to generate a polar group.

* * * * *